(12) United States Patent
Shirota et al.

(10) Patent No.: US 6,903,798 B2
(45) Date of Patent: Jun. 7, 2005

(54) PATTERN WRITING APPARATUS AND PATTERN WRITING METHOD

(75) Inventors: Hiroyuki Shirota, Kyoto (JP); Akira Kuwabara, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 10/898,197

(22) Filed: Jul. 26, 2004

(65) Prior Publication Data

US 2005/0002002 A1 Jan. 6, 2005

Related U.S. Application Data

(63) Continuation-in-part of application No. 10/394,261, filed on Mar. 24, 2003, now abandoned.

(30) Foreign Application Priority Data

May 16, 2002 (JP) ..................................... P2002-141320
Jun. 14, 2004 (JP) ..................................... P2004-174916

(51) Int. Cl.⁷ ........................ G03B 27/00; G03B 27/54; G03B 27/32; B41J 15/14
(52) U.S. Cl. ............................. 355/18; 355/67; 355/77; 347/241; 347/243
(58) Field of Search ............................. 355/18, 53, 54, 355/67, 77; 347/239, 241, 243; 430/22, 30

(56) References Cited

U.S. PATENT DOCUMENTS

| | | |
|---|---|---|
| 5,049,901 A | 9/1991 | Gelbart |
| 5,291,329 A | 3/1994 | Wakimoto et al. |
| 6,133,986 A | 10/2000 | Johnson |
| 6,251,550 B1 | 6/2001 | Ishikawa |
| 6,288,830 B1 | 9/2001 | Kinoshita |
| 6,425,669 B1 | 7/2002 | Mei et al. |
| 6,473,237 B2 | 10/2002 | Mei |
| 6,493,867 B1 | 12/2002 | Mei et al. |
| 6,537,738 B1 | 3/2003 | Mei et al. |
| 6,552,779 B2 * | 4/2003 | Mei ............................. 355/71 |
| 2003/0123040 A1 | 7/2003 | Almogy |

FOREIGN PATENT DOCUMENTS

| | | |
|---|---|---|
| EP | 0 528 285 A1 | 2/1993 |
| EP | 0 556 591 A1 | 8/1993 |
| JP | 62-21220 | 1/1987 |
| JP | 6-55776 | 3/1994 |
| JP | 06-083023 | 3/1994 |
| JP | 6-100829 | 12/1994 |
| JP | 2710519 | 10/1997 |
| JP | 2717035 | 11/1997 |
| JP | 10-112579 | 4/1998 |
| JP | 2875125 | 1/1999 |
| JP | 11-320968 | 11/1999 |
| JP | 2001-500628 A | 1/2001 |
| JP | 2001-133893 A | 5/2001 |
| JP | 3254248 | 11/2001 |

* cited by examiner

*Primary Examiner*—Alan Mathews
(74) *Attorney, Agent, or Firm*—McDermott Will & Emery LLP

(57) ABSTRACT

A pattern writing apparatus for writing a pattern on a photosensitive material comprises a head provided with a DMD having a micromirror group which spatially modulates reflected light. Light from the micromirrors of the DMD are directed to irradiation regions (61) on the substrate, respectively. The irradiation regions (61) are moved over the substrate with movement of the substrate relative to the head. The DMD is provided within the head so that the direction of arrangement of the irradiation regions (61) is tilted relative to the main scanning direction, and a center-to-center distance (L1) along the sub-scanning direction between two adjacent irradiation regions (61) arranged in the main scanning direction is made equal to a pitch (P1) of writing cells (620) on the substrate with respect to the sub-scanning direction. ON/OFF control of light irradiation of each irradiation region is performed each time the irradiation regions 61 move a distance equal to twice a pitch (P2).

18 Claims, 24 Drawing Sheets

F/G. 6

FIG. 7
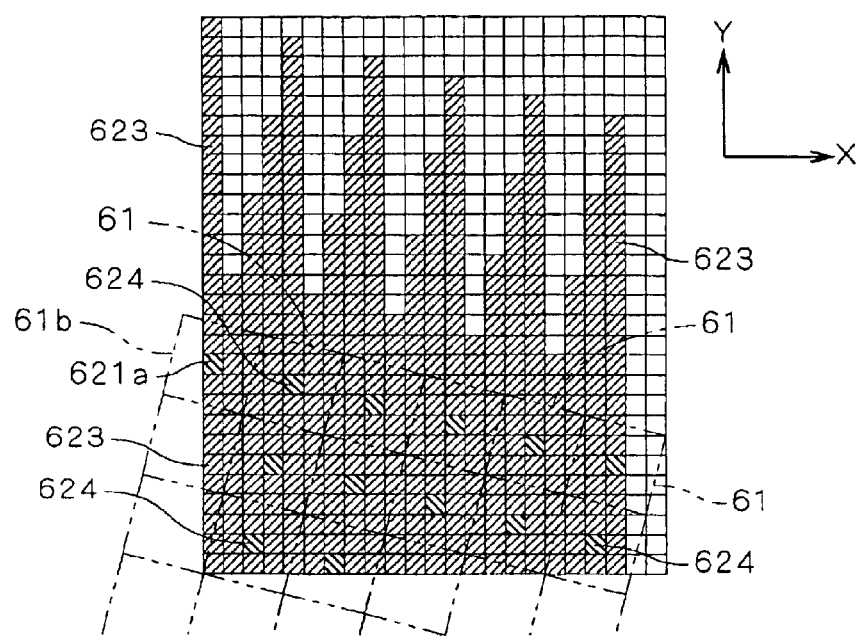
FIG. 8A  FIG. 8B  FIG. 8C
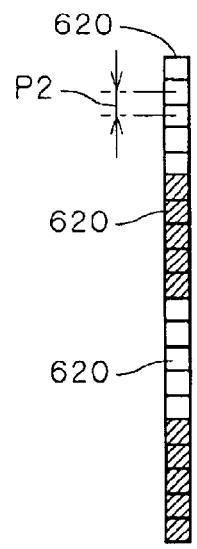
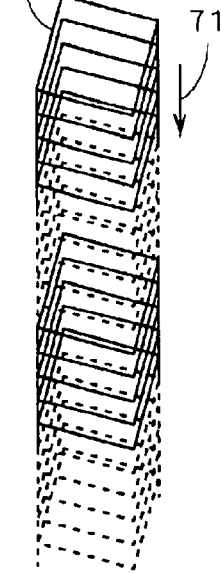
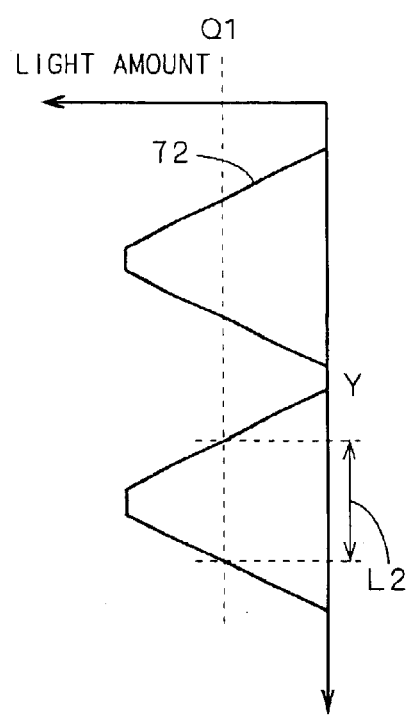

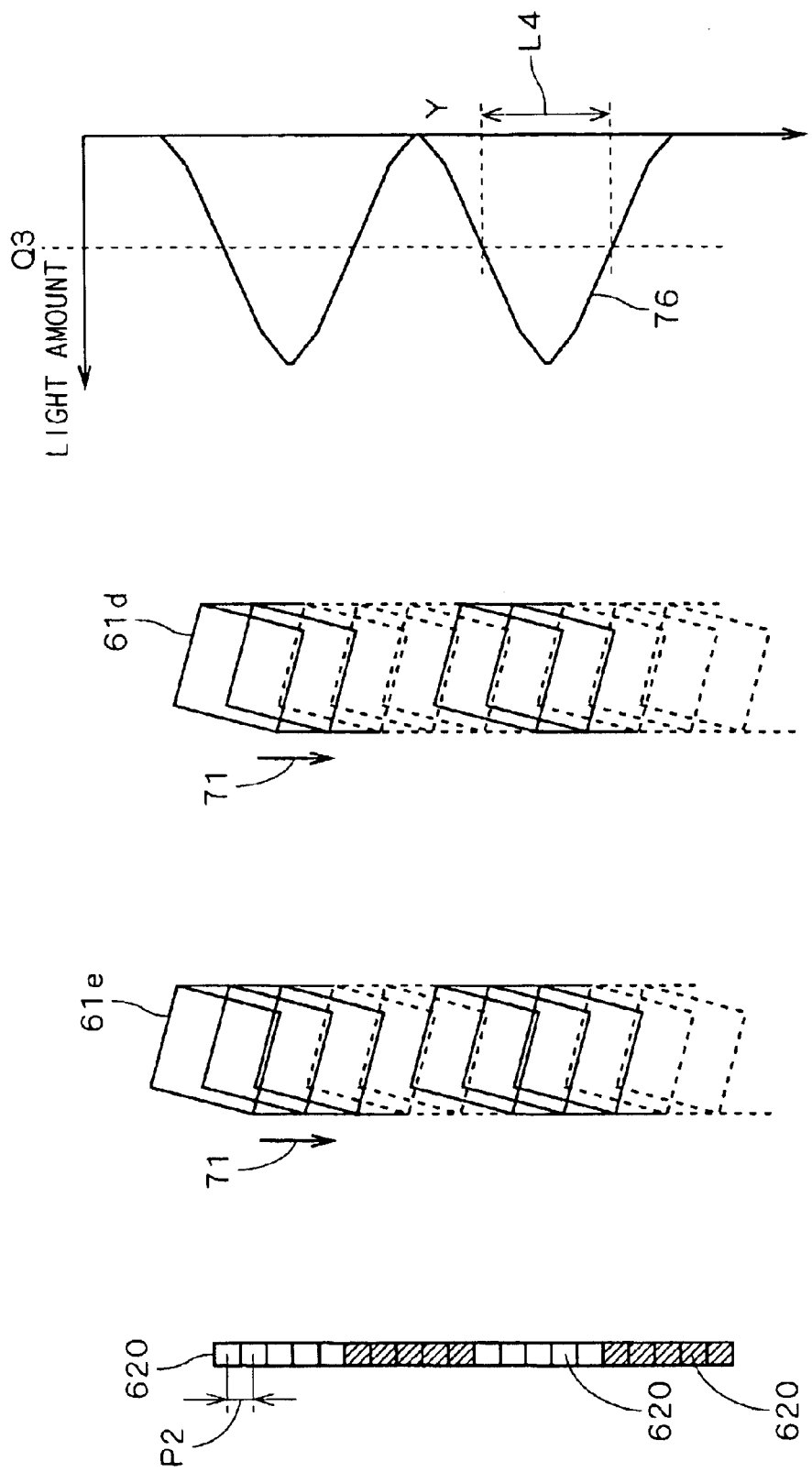

PATTERN WRITING APPARATUS AND PATTERN WRITING METHOD

CROSS-REFERENCE TO RELATED APPLICATION

This application is a continuation-in-part of application Ser. No. 10/394,261, filed Mar. 24, 2003 abandoned.

BACKGROUND OF THE INVENTION

1. Field of the Invention

The present invention relates to an apparatus and method of writing a pattern by light irradiation to a photosensitive material.

2. Description of the Background Art

Conventionally well known are techniques for applying a light beam modulated by a spatial light modulator such as a digital micromirror device (DMD) onto a photoresist film formed on a substrate such as a semiconductor substrate or a printed circuit board.

Japanese Patent Application Laid-open No. 62-21220 discloses a technique for writing a fine pattern by applying a light beam which is spatially modulated by a micromirror group of a DMD onto a photosensitive material and by moving the photosensitive material and controlling a signal given to the DMD every time the photosensitive material passes a predetermined distance.

Also, Japanese Patent Application Laid-open No. 2001-133893 suggests a technique for writing a finer pattern by tilting an image formed by a DMD on a photosensitive material at 45 degrees relative to a main scanning direction. FIG. 1 is a diagram for explaining the pattern writing suggested in Japanese Patent Application Laid-open No. 2001-133893. In an image 90 formed by a DMD on a photosensitive material in FIG. 1, an irradiation region group 91 arranged in a row in a direction perpendicular to the main scanning direction corresponds to a set of main scan mirrors of the DMD, and another irradiation region group 92 which is arranged in the direction perpendicular to the main scanning direction and each of whose regions is located between adjacent regions of the irradiation region group 91, corresponds to a set of interpolation main scan mirrors of the DMD. The image 90 is scanned on the photosensitive material in a direction indicated by arrow 94, i.e., the main scanning direction, and at some point in time, a space between adjacent regions on the photosensitive material which are exposed by the respective main scan mirrors is exposed by each of the interpolation main scan mirrors. This achieves fine pattern writing.

When changing an image (i.e., a pattern indicating spatial modulation of a light beam) formed on a photosensitive material, the spatial light modulator such as a DMD requires, for example, time to write data into memory cells each corresponding to one light modulating element and time between receiving a reset pulse and holding each light modulating element in position (i.e., fixing the position (orientation) of each micromirror of the DMD). However, there are technical limitations to what we can do to shorten such times. Thus, it is not easy to drive the spatial light modulator at higher speed and thereby to speed up pattern writing by exposure.

For example, in a DMD where 16 blocks of micromirrors, each block containing 48 rows and 1024 columns of micromirrors, are arranged in a column direction to form a matrix of 768 rows and 1024 columns, control is exercised block by block. However, addressing and writing data into the blocks is generally performed on line by line; therefore, when this DMD is employed in the technique shown in FIG. 1, data must be written into every block containing part of the main scan mirrors and the interpolation main scan mirrors, which makes it difficult to achieve high speed pattern writing.

SUMMARY OF THE INVENTION

The present invention is directed to a pattern writing apparatus for writing a pattern on a photosensitive material, and an object of the present invention is to write a fine pattern at high speed.

According to a preferred embodiment of the present invention, a pattern writing apparatus for writing a pattern by applying light to a photosensitive material, comprises: a light irradiating part for applying modulated light to each of irradiation regions of an irradiation region group which are arranged at equal pitches in two directions perpendicular to each other on a photosensitive material; a scanning mechanism for scanning the irradiation region group over a photosensitive material in a scanning direction which is tilted relative to a direction of arrangement of the irradiation region group, and causing a plurality of irradiation regions to move relative to writing regions of a writing region group, respectively, which are fixedly arranged in the scanning direction and a direction perpendicular to the scanning direction at equal writing pitches on the photosensitive material; and a controller controlling an amount of light applied to each of the writing regions on a photosensitive material by exercising individual ON/OFF control of light irradiation of the irradiation region group in synchronization with scanning of the irradiation region group, wherein a center-to-center distance along the direction perpendicular to the scanning direction between adjacent irradiation regions arranged in a direction extending approximately along said scanning direction out of said two directions in which the irradiation regions are arranged is equal to the writing pitch, a center-to-center distance along the scanning direction between the adjacent irradiation regions is equal to "a times" the writing pitch (a is an integer equal to or larger than 2), the controller exercises ON/OFF control of the light irradiation once during relative movement of the irradiation region group by a distance equal to "n times" the writing pitch (n is an integer equal to or larger than 2), and ($a^2+1$) and n are relatively prime.

The present invention allows multiple light irradiation on the photosensitive material with efficiency, thereby achieving high-speed pattern writing.

According to a further preferred embodiment of the present invention, light irradiation of an irradiation region is controlled to be OFF before relative movement of the irradiation region group by a distance equal to n times the writing pitch is finished after light irradiation of the irradiation region is controlled to be ON. This improves writing resolution.

According to a further preferred embodiment of the present invention, each element of a light modulating element group is a micromirror that changes its position. The scanning mechanism accelerates high-speed pattern writing by continuously moving the irradiation region group.

More specifically, the pattern writing apparatus writes a pattern on a photoresist film on a substrate for a printed circuit board.

The present invention is also directed to a pattern writing method for writing a pattern on a photosensitive material.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4, 6 and 7 are diagrams for explaining an exposure operation by the pattern writing apparatus;

FIGS. 8A, 8B and 8C are diagrams for explaining light irradiation of writing cells with respect to a main scanning direction;

FIGS. 11A, 11B, 11C and 11D are diagrams for explaining light irradiation of writing cells with respect to the main scanning direction in double-speed mode operation;

DESCRIPTION OF THE PREFERRED EMBODIMENTS

Figure 1:
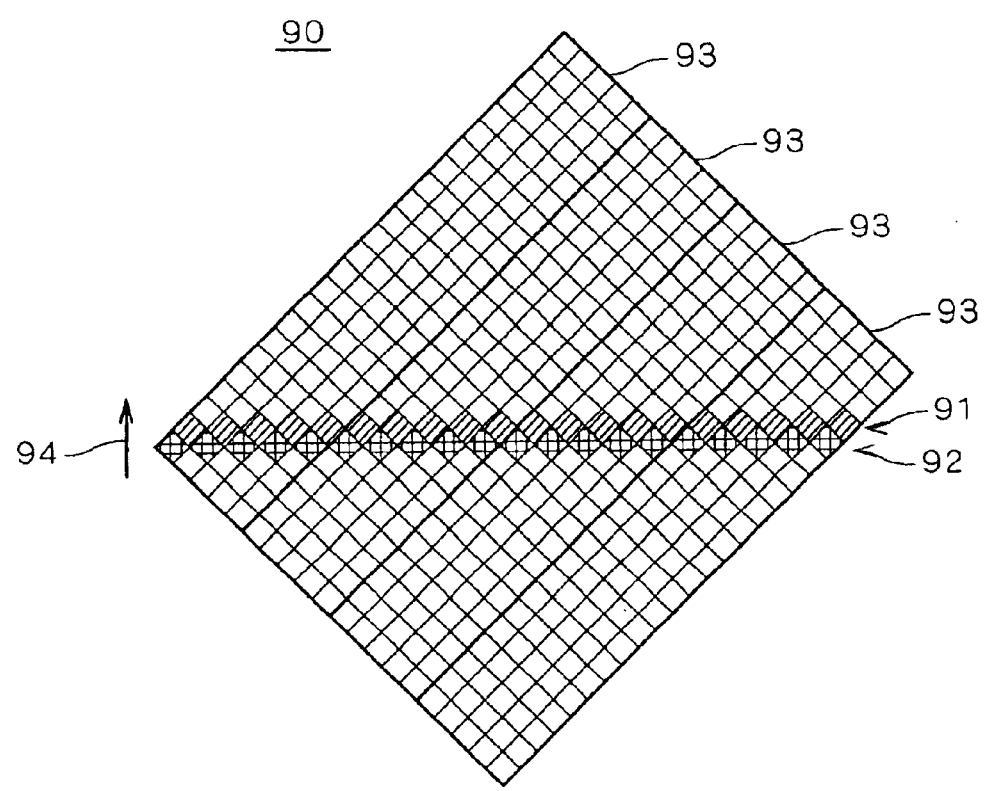
FIG. 1 is a diagram for explaining an exposure operation by a conventional pattern writing apparatus.
Figure 2:
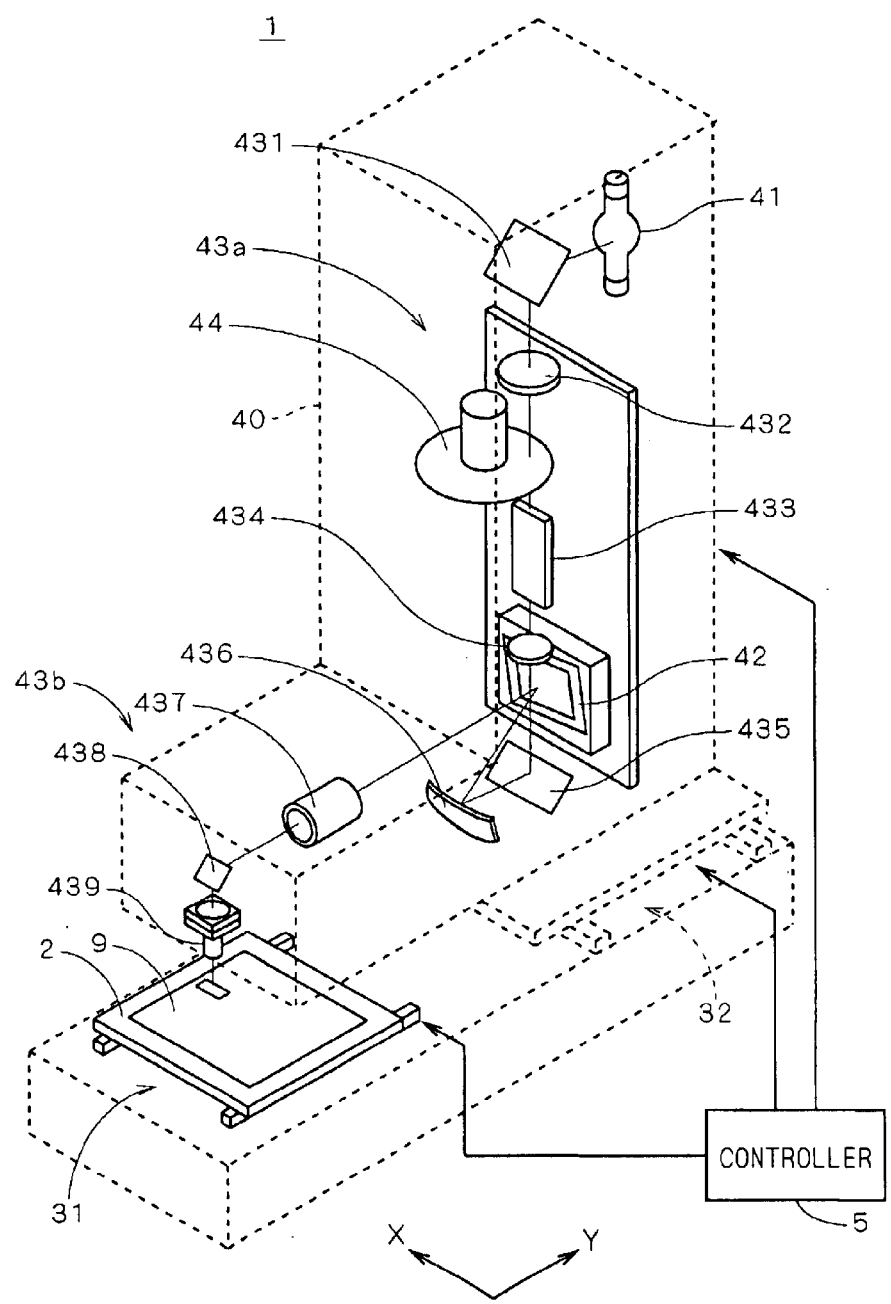
FIG. 2 is a diagram illustrating a general structure of a pattern writing apparatus according the present invention.

FIG. 2 is a diagram illustrating the structure of a pattern writing apparatus 1 according to a first preferred embodiment of the present invention. In FIG. 2, part of the apparatus is shown by dashed lines for illustration of the internal structure of the apparatus. The pattern writing apparatus 1 comprises a stage 2 holding a substrate 9 on which a resist film is formed, a stage moving mechanism 31 for moving the stage 2 in the Y direction in FIG. 2, a head 40 functioning as a light irradiating part which emits a light beam toward the substrate 9, a head moving mechanism 32 for moving the head 40 in the X direction in FIG. 2, and a controller 5 connected to the stage moving mechanism 31, the head 40 and the head moving mechanism 32.

The head 40 includes a light source 41 which is a lamp for emitting light and a DMD 42 having a micromirror group arrayed in a lattice arrangement, wherein the micromirror group reflects a light beam from the light source 41 to provide a two-dimensionally spatially modulated light beam.

More specifically, the light emitted from the light source 41 is directed through a mirror 431 and a lens 432 to a light control filter 44 in which the light beam is controlled to a desired amount of light. The light beam transmitted through the light control filter 44 is directed through a rod integrator 433, a lens 434 and a mirror 435 to a mirror 436 which then focuses and directs the light beam onto the DMD 42. The light beam incident on the DMD 42 is uniformly applied to the micromirror group of the DMD 42 at a predetermined angle of incidence (e.g., 24 degrees). Thus, the mirror 431, the lens 432, the rod integrator 433, the lens 434, the mirror 435 and the mirror 436 constitute an illumination optical system 43a for directing light from the light source 41 to the DMD 42.

A light beam (i.e., a spatially modulated light beam) generated from only reflected light from part of micromirrors of the DMD 42 which are set in a predetermined position (a position (or orientation) corresponding to an ON state later to be described in description of light irradiation by the DMD 42) enters a zoom lens 437 in which the light beam is controlled in magnification and directed through a mirror 438 to a projector lens 439. The light beam from the projector lens 439 is then applied to a region on the substrate 9 which is optically conjugate to the micromirror group. In the pattern writing apparatus 1, therefore, the zoom lens 437, the mirror 438 and the projector lens 439 constitute a projection optical system 43b for directing light from each of the micromirrors to a corresponding irradiation region on the substrate 9.

The stage 2 is fixed on a movable side of the stage moving mechanism 31 which is a linear motor, and the controller 5 controls the stage moving mechanism 31 so that the irradiation region group irradiated with light from the micromirror group (herein, one micromirror corresponds to one irradiation region) continuously moves relative to the substrate 9 in the Y direction in FIG. 2 over the photoresist film. That is, the irradiation region group is fixed relative to the head 40 and moves over the substrate 9 with movement of the substrate 9.

The head 40 is fixed on a movable side of the head moving mechanism 32 and intermittently moves in a sub-scanning direction (X direction) perpendicular to the main scanning direction (the Y direction in FIG. 2) of the irradiation region group. That is, every time a main scan is completed, the head moving mechanism 32 moves the head 40 in the X direction to a start position for the next main scan.

Figure 3:
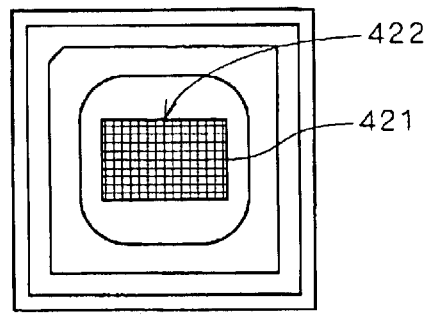
FIG. 3 is a diagram illustrating a DMD.

FIG. 3 is a diagram illustrating the DMD 42. The DMD 42 is a spatial light modulator having a micromirror group 422 in which a number of micromirrors are arrayed at equal pitches in a lattice arrangement on a silicon substrate 421 (hereinafter, they are described as an array of M rows and N columns in two directions perpendicular to each other). Each of the micromirrors is tilted at a predetermined angle by the action of the static electric field, according to data written into its corresponding memory cell.

When a reset pulse is applied from the controller 5 shown in FIG. 2 to the DMD 42, each of the micromirrors is tilted in unison in a predetermined position about a diagonal line of its reflecting surface according to data written in its corresponding memory cell. Thereby, the light beam applied to the DMD 42 is reflected in directions of the tilting of the respective micromirrors and light irradiation of the irradiation regions is ON/OFF controlled. That is, when micromirrors whose memory cells are written with data indicating the ON state receive a reset pulse, light incident on those micromirrors is reflected onto the zoom lens 437 and applied to corresponding irradiation regions. On the other hand, micromirrors in the OFF reflect incident light to a predetermined position other than that of the zoom lens 437; thus, no light is directed to their corresponding irradiation regions.

Figure 4:
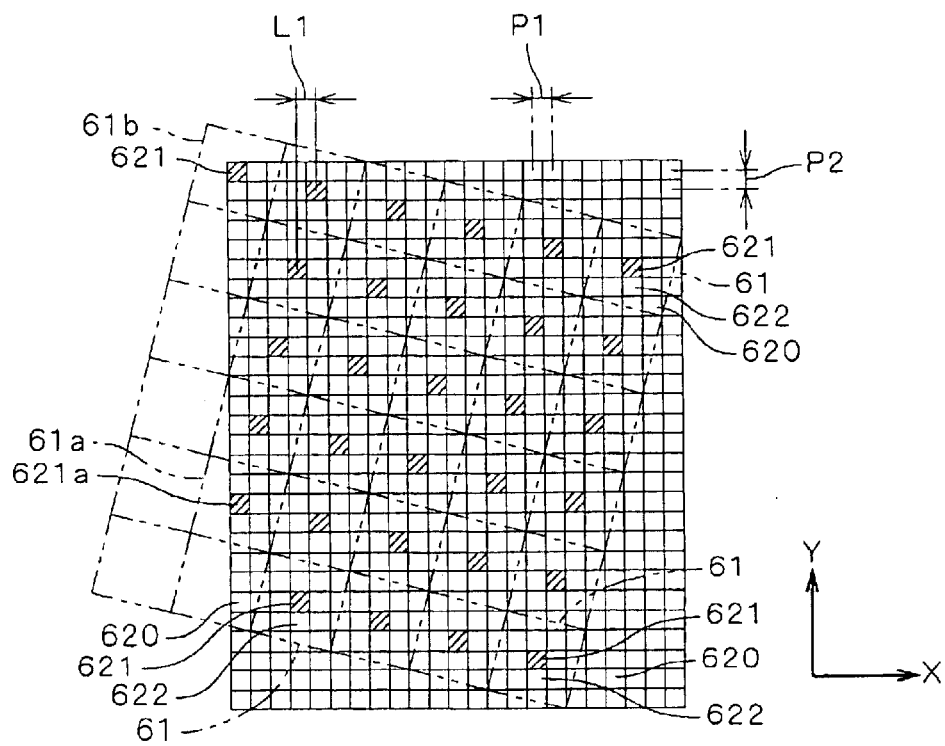

FIG. 4 is a diagram illustrating irradiation regions 61 and writing cells 620 on the substrate 9 in the pattern writing apparatus 1. The irradiation regions 61 are regions fixed relative to the head 40, and the writing cells 620 are regions fixed on the substrate 9 and corresponding to the smallest unit of writing (which is 2 μm square, for example). With movement of the head 40 relative to the substrate 9, the irradiation regions 61 move over the writing cells 620. The writing cells 620 are exposure regions obtained by dividing the region on the substrate 9 with reference to central positions of the irradiation regions 61 (more precisely, central positions of the continuously moving irradiation regions 61) during one cycle of exposure control by the DMD 42. In FIG. 4, the lattice irradiation region group irradiated with light from the respective micromirrors of the DMD 42 is indicated by dash-double-dot lines and the writing cell group on the substrate 9 is indicated by solid lines. It is noted that only parts of the writing cells 620 and the irradiation regions 61 are shown in FIG. 4.

The writing cells 620 are rectangular exposure regions arranged at pitches P1 in the X direction (sub-scanning direction) and at pitches P2 in the Y direction (main scanning direction) in FIG. 4, and light irradiation centered about the writing cells 620 is performed according to corresponding writing cell data (data written in the DMD 42). The irradiation regions 61 irradiated with reflected light from the respective micromirrors of the DMD 42 are approximately square regions which correspond in shape to the micromirrors. The irradiation regions 61 are arranged at equal pitches in two directions perpendicular to each other, and the DMD 42 is provided in a tilted (or inclined) position within the head 40 so that the directions of arrangement of the irradiation regions 61 are tilted (or inclined) relative to the main scanning direction.

The tilt angle of the irradiation region group relative to the main scanning direction is determined so that a center-to-center distance L1 along the sub-scanning direction (X direction) between two adjacent irradiation regions 61 arranged in a direction which extends approximately along the main scanning direction (i.e., in a direction which forms a smaller angle with the main scanning direction) out of the two directions of arrangement of the irradiation region group, is equal to the pitch P1 of the writing cells 620 in the X direction (a center-to-center distance between adjacent writing cells 620 in the sub-scanning direction). In the following description, a direction approximately along the Y direction is referred to as a "column direction" of the DMD 42 and another direction approximately along the X direction is referred to as a "row direction".

Figure 5:
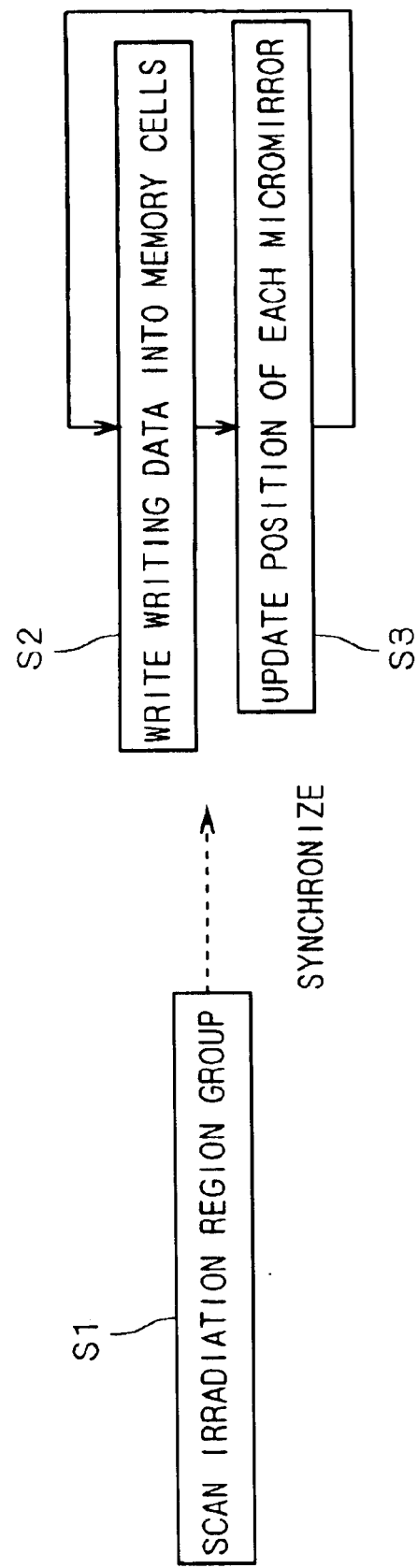
FIG. 5 is a flowchart showing the flow of the exposure operation.

Next, the basic operation of the pattern writing apparatus 1 for writing a pattern on a photoresist film on the substrate 9 is described with reference to FIG. 5, and after that, double-speed mode operation which is preferable will be described. In the following description of the operation of the pattern writing apparatus 1, the irradiation region group moves relative to the writing cell group in both the main scanning direction and the sub-scanning direction (step S1).

At the start of exposure, writing cell data to be written into writing cells 621 which correspond to first locations of the irradiation regions 61, out of the writing cells 620 in FIG. 4, (i.e., the writing cells 621 located at the centers of the respective irradiation regions 61) is transmitted from the controller 5 to corresponding memory cells of the respective micromirrors of the DMD 42 (step S2). The controller 5 then transmits a reset pulse to the DMD 42, whereby each of the micromirrors is tilted in a position (orientation) responsive to the memory cell data and a first exposure (i.e., ON/OFF control of light irradiation) of the writing cells 621 is performed (step S3).

Figure 6:
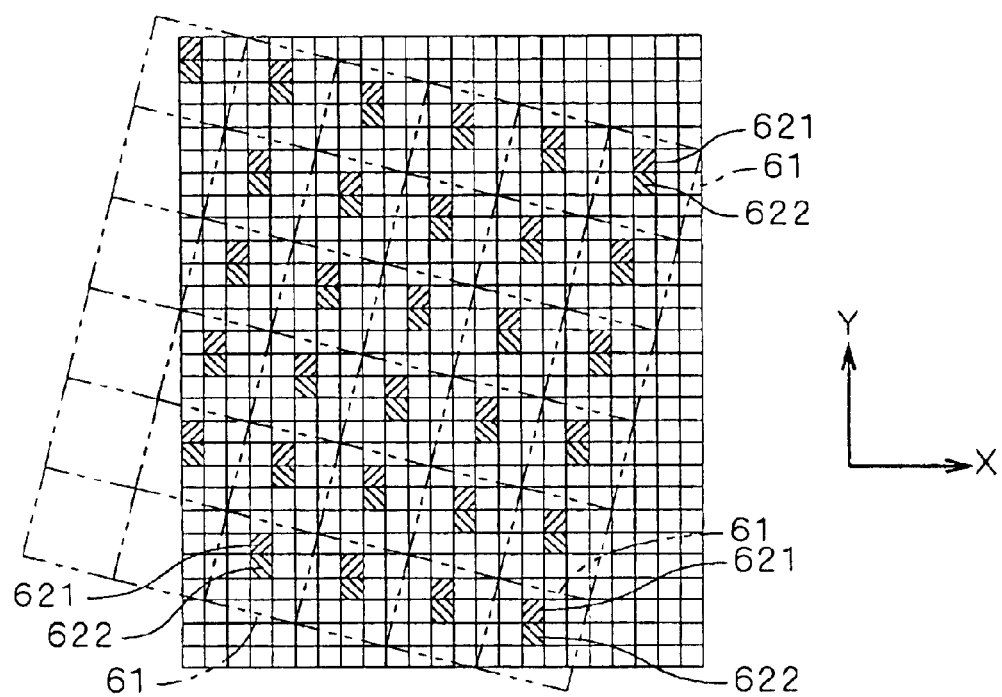

After the transmission of the reset pulse, writing cell data corresponding to the next writing cells 622 (i.e., the writing cells 622 located adjacent to the writing cells 621 on the (−Y) side) is transmitted and written into memory cells of the respective micromirrors. The transmission of a reset pulse to the DMD 42 is performed in synchronization with the operation of the stage moving mechanism 31 for continuously moving the stage 2 in the main scanning direction. More specifically, when the irradiation regions 61 move the pitch P2 in the main scanning direction (the (−Y) direction in FIG. 4) after the application of the first reset pulse, the next reset pulse is transmitted to the DMD 42 and each of the micromirrors is tilted in a position responsive to the writing cell data. Thereby, as shown in FIG. 6, the exposure of the writing cells 622 is performed with the second reset pulse.

When the controller 5 repeats the above exposure operation in synchronization with control of the stage moving mechanism 31 and the DMD 42, a second exposure centered about the writing cells 621 which were exposed by the first exposure is performed with the eighteenth reset pulse. FIG. 7 is a diagram illustrating the exposure with the eighteenth reset pulse. In FIG. 7, writing cells 623 exposed only once and writing cells 624 exposed twice are distinguished by the direction of cross-hatching.

Looking at, for example, a writing cell 621a corresponding to an irradiation region 61a at the first reset pulse shown in FIG. 4. As illustrated in FIG. 7, the irradiation region 61b (located on the (+Y) side of the irradiation region 61a) performs an exposure centered about the writing cell 621a with the eighteenth reset pulse. That is, the irradiation region 61b which is spaced four irradiation regions in the column (+Y) direction of the DMD 42 and one irradiation region in the row (−X) direction from the irradiation region 61a, passes over and exposes again the writing cell 621a which was irradiated with light by the irradiation region 61a.

By repeating the above operation, the pattern writing apparatus 1, when employing the DMD 42 comprised of M rows of micromirrors, repeats exposures on the substrate 9 (M/4) times, thereby permitting exposures centered about each of the writing cells 620 with a (M/4)-step gradation.

Next, the relationship between ON/OFF control of light irradiation of the irradiation regions 61 and photosensitivity of the writing cells 620 is described. Since exposure of a single writing cell 620 actually causes light irradiation of approximately the whole area of a single irradiation region 61, light is applied also to writing cells 620 located around a writing cell 620 concerned (see FIGS. 4, 6 and 7).

FIG. 8A is a diagram illustrating a pattern written on the writing cells 620 arranged in the main scanning direction, when ON/OFF control of light irradiation of a single irradiation region 61 is carried out for every five writing cells 620. FIG. 8B illustrates the path of movement of a single irradiation region 61 relative to the writing cells 620 in a direction indicated by arrow 71 (main scanning direction). FIG. 8C is a chart indicating the variation of the amount of light applied from the irradiation region 61 in FIG. 8B with respect to the Y direction (main scanning direction). FIG. 8C is drawn on the presumption that exposure control of the irradiation regions 61 passing over positions displaced in the sub-scanning direction is also done in the same way.

Since the irradiation region 61 in either the ON state (indicated by solid lines) or in the OFF state (indicated by dashed lines) moves continuously relative to the writing cells 620 as illustrated in FIG. 8B, the cumulative amount of light applied to the writing cells 620 has an angular distribution as indicated by line 72 in FIG. 8C. Thus, the pattern writing as illustrated in FIG. 8A can be achieved by, for example, controlling the angular shaped cumulative amount of light indicated by the line 72 such that a distance in the main scanning direction that the irradiation region 61 remains in the ON state (a distance five times the pitch P2 of the writing cells 620 in FIG. 8A) is equal to a length L2 that the photoresist film is exposed with an amount of light Q1 (per unit area) in FIG. 8C. (More precisely, the cumulative amount of light is controlled by controlling the intensity of a light beam applied from the light control filter 44 shown in FIG. 2 to the DMD 42.)

Figure 9A:
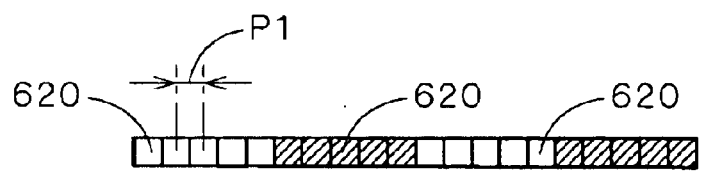
FIGS. 9A, 9B and 9C are diagrams for explaining light irradiation of writing cells with respect to a sub-scanning direction.
Figure 9B:
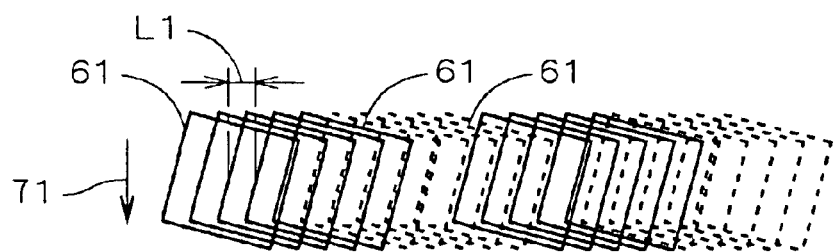
Figure 9C:
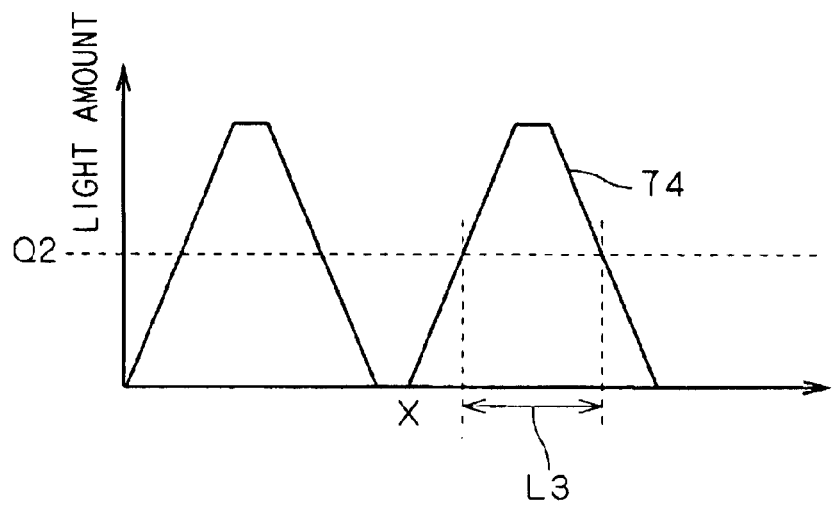

FIGS. 9A, 9B and 9C are diagrams for explaining the cumulative amount of light with respect to the sub-scanning direction when the ON/OFF control of the irradiation regions 61 is carried out for every five writing cells 620. FIG. 9A illustrates a pattern written on the writing cells 620 with respect to the sub-scanning direction, and FIG. 9B illustrates that a plurality of irradiation regions 61 move in the direction indicated by arrow 71 (main scanning direction) relative to the writing cells 620 and pass over a predetermined position in the main scanning direction. FIG. 9C is a chart indicating the variation of the cumulative amount of light applied from the plurality of irradiation regions 61 in FIG. 9B with respect to the X direction (sub-scanning direction). FIG. 9C is drawn on the presumption that the ON/OFF control of light irradiation of the irradiation regions 61 is not carried out during one main scan.

In FIG. 9B, five irradiation regions 61 in their ON states (indicated by solid lines) are arranged with the center-to-center distances L1 (i.e., at pitches P1) and next to those regions, five irradiation regions 61 in their OFF states (indicated by dashed lines) are arranged similarly with the center-to-center distances L1. Since each of the irradiation regions 61, as a general rule, moves only in the main scanning direction during the exposure operation, the cumulative amount of light with respect to the sub-scanning direction essentially varies discontinuously. However, because each of the irradiation regions 61 continuously moves in the main scanning direction in a tilted position, in practice the cumulative amount of light with respect to the X direction continuously varies in an angular shape as indicated by line 74 in FIG. 9C. Thus, as is the case of FIG. 8C, the pattern writing as illustrated in FIG. 9A can be achieved by controlling the intensity of light applied to the DMD 42 such that a distance five times the pitch P1 is equal to a length L3 that the photoresist film is exposed with an amount of light Q2 as indicated by the line 74.

As above described, when looked at with respect to only the main scanning direction or the sub-scanning direction, the amount of light applied onto the substrate 9 can be varied in an angular shape with respect to those directions. Further in the pattern writing apparatus 1, as previously described, the controller 5 performs individual ON/OFF control of light irradiation of the irradiation region group in synchronization with the scanning of the irradiation region group; therefore, when the DMD 42 comprised of M rows of micromirrors is employed, the amount of light irradiation centered about each of the writing cells 620 can be controlled with a (M/4)-step gradation. The pattern writing apparatus 1 can, therefore, achieve pattern writing while permitting highly precise control of the pattern linewidths with respect to both the main scanning direction and the sub-scanning direction. Furthermore, multiple exposures result in a reduction in the influence of variations in the intensity of reflected light from the DMD 42.

In general, the pitches P1 and P2 are made equal and the irradiation regions 61 are square in shape; thus, the smallest controllable units of linewidths in the main scanning direction and in the sub-scanning direction can be made equal.

Figure 10:
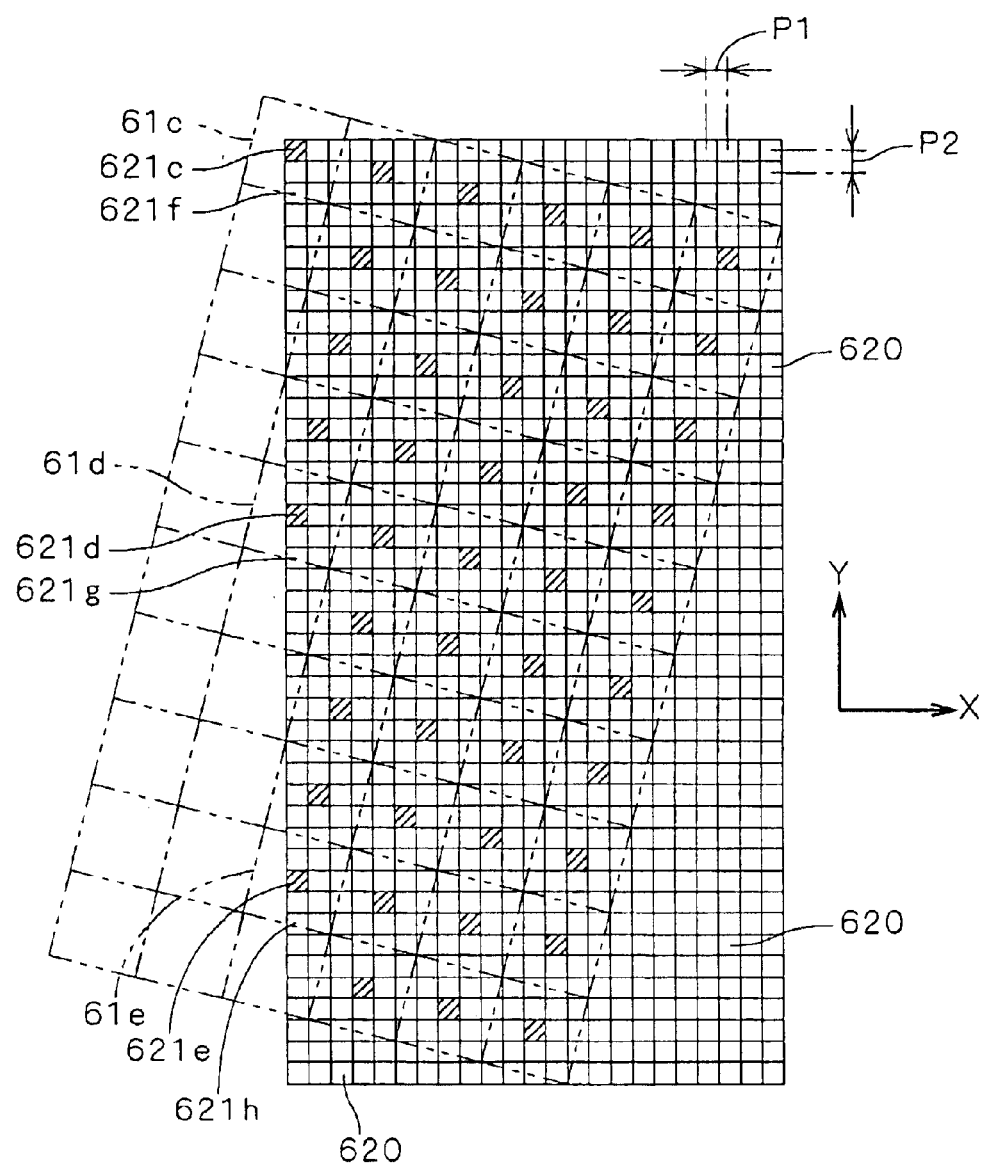
FIG. 10 is a diagram for explaining another example of the exposure operation by the pattern writing apparatus.

Next, another example of the operation of the pattern writing apparatus 1 for writing a pattern onto a photoresist film on the substrate 9 by exposure is described with reference to FIG. 10. In FIG. 10, the irradiation regions 61 and the writing cells 620 are arranged in the same form as shown in FIGS. 4, 6 and 7, and ON/OFF control of the irradiation regions 61 is performed once while the irradiation regions 61 move through a distance that is twice the pitch P2 in the (−Y) direction relative to the writing cells 620 (hereinafter, this operation is referred to as a "double-speed mode operation").

More specifically, looking at a column of writing cells 620 on the (−X) side. With a first reset pulse, exposures centered about a writing cell 621c on the (+Y) side, about a writing cell 621d spaced a distance that is 17 times the pitch P2 from the writing cell 621c in the (−Y) direction, and about a writing cell 621e spaced a distance that is 34 times the pitch P2 from the writing cell 621c in the (−Y) direction are performed respectively by the irradiation regions 61c, 61d and 61e.

Subsequently, when the irradiation region group moves a distance that is twice the pitch P2 relative to the writing cell group in the (−Y) direction, a second reset pulse is applied to the DMD 42 and exposures of a writing cell 621f spaced a distance that is 2 times the pitch P2 from the writing cell 621c in the (−Y) direction, of a writing cell 621g spaced a distance that is 19 times the pitch P2 from the writing cell 621c in the (−Y) direction, and of a writing cell 621h spaced a distance that is 36 times the pitch P2 from the writing cell 621c in the (−Y) direction are performed respectively by the irradiation regions 61c, 61d and 61e.

From the above operation, it is seen that, for example when the writing cell 621e is exposed by the irradiation region 61e in a first half of the duration between the first and second reset pulses, a multiple exposure of the writing cell 621e is performed by the irradiation region 61d in a second half of the duration between the ninth and tenth reset pulses. Further, in a first half of the duration between the eighteenth and nineteenth reset pulses, another multiple exposure of the writing cell 621e is performed by the irradiation region 61c. Thus, in the double-speed mode operation, multiple exposures of each of the writing cells 620 are performed at the same time as exposures of its adjacent writing cells 620 arranged in the main scanning direction.

Next, we describe the relationship between light irradiation of the irradiation regions 61 and the amount of light applied to the writing cells 620 in the double-speed mode operation. FIG. 11A illustrates a pattern written on the writing cells 620 with respect to the main scanning direction in the double-speed mode operation, and FIG. 11B illustrates the path of movement of an antecedent irradiation region 61e relative to the writing cells 620 in the direction indicated by arrow 71 (main scanning direction). FIG. 11C illustrates the path of movement of a subsequent irradiation region 61d relative to the writing cells 620 in the direction indicated by arrow 71, and FIG. 11D is a chart illustrating the variation of the cumulative amount of light applied from the irradiation regions 61e and 61d in FIGS. 11B and 11C with respect to the Y direction (main scanning direction).

In FIG. 11B, ON/OFF control is performed every time the irradiation region 61e moves through a distance that is twice the pitch P2, wherein the irradiation region 61e remains in the ON state during three cycles of the ON/OFF control and then remains in the OFF state during two cycles of the ON/OFF control. In FIG. 11C, ON/OFF control is performed also every time the irradiation region 61d moves through a distance that is twice the pitch P2, wherein the irradiation region 61d remains in the ON state during two cycles of the ON/OFF control and then remains in the OFF state during three cycles of the ON/OFF control. In this exposure operation, the cumulative amount of light applied onto the writing cells 620 arranged in the Y direction has an angular distribution with respect to the Y direction as indicated by line 76 in FIG. 11D (more precisely, multiple exposures are performed also by other irradiation regions 61 arranged in the main scanning direction). Further, when the photoresist film is exposed with an amount of light Q3 shown in FIG. 11D, the pattern writing as illustrated in FIG. 11A can be achieved.

Since, as previously described, multiple exposures allow the amount of light irradiation to be controlled with a multiple-step gradation, the angular distribution of the light amount illustrated in FIG. 11D can be varied in shape, and even in the double-speed mode operation, the width of a pattern written on the photoresist film in the main scanning direction (the pattern linewidth in the sub-scanning direction) can be controlled with high precision. It is noted that the pattern width in the sub-scanning direction can also be controlled with high precision because the cumulative amount of light applied from a plurality of irradiation regions 61 arranged in the sub-scanning direction can also has an angular distribution as described with reference to FIG. 9.

As above described, in the double-speed mode operation of the pattern writing apparatus 1, the controller 5 performs ON/OFF control of light irradiation of the irradiation regions 61 by transmitting a reset pulse once while the irradiation regions 61 are scanned by a distance that is twice the pitch P2. The pattern writing apparatus 1 can thus achieve high-speed exposures while permitting control of the pattern linewidth.

In the double-speed mode operation, light amount control of each of the writing cells 620 is not so flexible as in the operation illustrated in FIGS. 4, 6 and 7 in which light amount control with a (M/4)-step gradation is achieved. However, since the minimum pattern linewidth to be written (i.e., pattern resolution) is usually set to be about several times greater than the smallest controllable unit of linewidth (i.e., linewidth accuracy), there is no problem in practice in the double-speed mode operation. For example, in the pattern writing apparatus 1, the linewidth or the width of a space between adjacent lines is 15 μm and the smallest controllable unit of the linewidth or the width of the space is 2 μm.

In the example of the operation shown in FIG. 10, multiple exposures can also reduce the influence of variations in the amount of light applied from each of the irradiation regions 61.

Figure 12A:
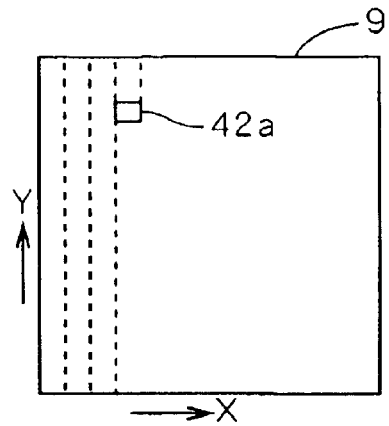
FIGS. 12A and 12B are diagrams for comparison between a comparative example and the pattern writing apparatus according to the present invention.
Figure 12B:
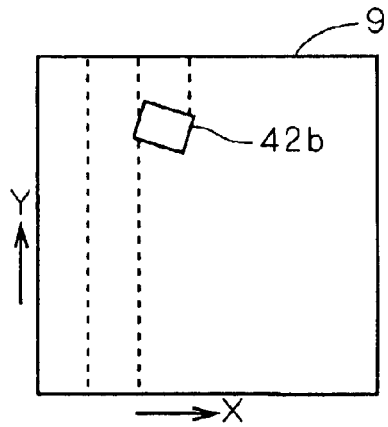

FIGS. 12A and 12B are diagrams for comparison between pattern writing by the pattern writing apparatus 1 and pattern writing when the direction of arrangement of the irradiation regions is not tilted relative to the main scanning direction (hereinafter, the latter is referred to as a "comparative example"). FIG. 12A illustrates the pattern writing in the comparative example, and FIG. 12B illustrates the pattern writing in the double-speed mode operation of the pattern writing apparatus 1. In the comparative example, each of the irradiation regions needs to be set equal in size to the writing cells and thus, an image 42a formed by the DMD 42 in FIG. 12A is smaller than an image 42b in FIG. 12B.

The DMD employed herein has 16 blocks, each block containing 14-μm-square micromirrors arranged in 48 rows and 1024 columns at equal pitches in two directions perpendicular to each other (row and column directions), and those 16 blocks are arranged in a column direction to form a matrix of 768 rows and 1024 columns of micromirrors. A group of micromirrors in one block are tilted in unison at either (+12) degrees or at (−12) degrees relative to a base plane about diagonal lines of their reflecting surfaces.

The pitches P1 and P2 of the writing cells in the sub-scanning direction and in the main scanning direction are set to 2 μm. In the pattern writing apparatus 1, the zoom lens 437 and the projector lens 439 make reducing projection so that bidirectional pitches between irradiation regions 61 (pitches with respect to the row and column directions of the DMD 42) are about 8.25 μm.

Figure 13:
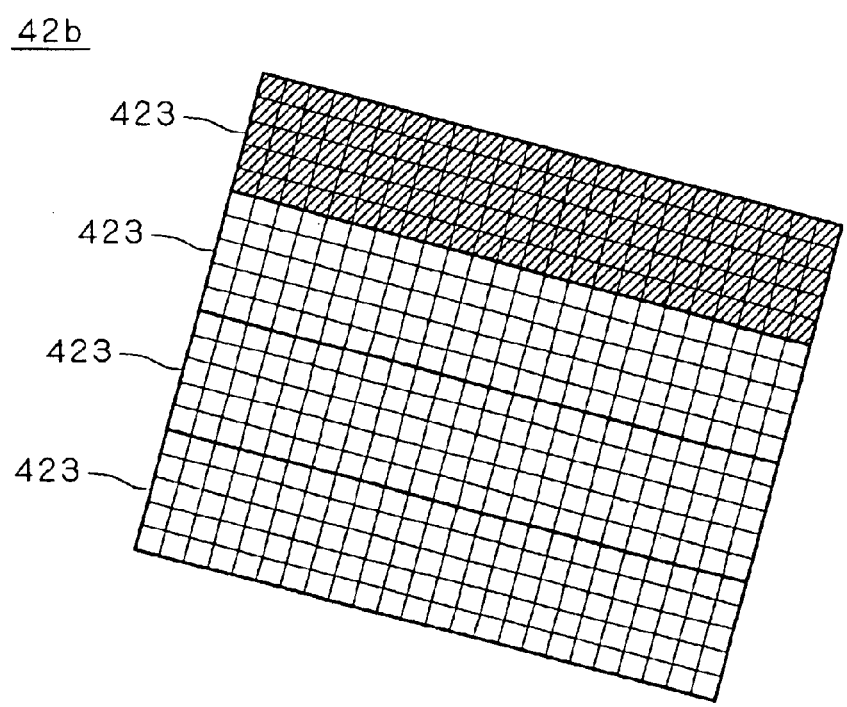
FIG. 13 is a diagram illustrating an image formed by the DMD on a substrate.

In the comparison of FIGS. 12A and 12B, only one block of micromirrors, out of 768 rows and 1024 columns of micromirrors, is used in order to speed up the DMD (i.e., to speed up data writing or to simplify the operation). FIG. 13 is a diagram schematically illustrating the image 42b formed by the DMD 42 on the substrate 9, in which an irradiation region group 423 corresponding to one block to be used is cross-hatched (in practice, there exist 16 blocks, each block containing a number of micromirrors.) Under the above condition, since the data transfer rate is 7.6 Gigabits per second, the shortest possible time to write data into memory cells is about 6.5 micro seconds. However, in consideration of time to hold the micromirrors after reset (i.e., time required to fix the positions of the micromirrors; about 15 micro seconds), the shortest exposure time of a single writing cell 620 (i.e., the shortest time until the next reset pulse is applied) is set to 24 micro seconds. It is noted here that the writing cells on the substrate 9 are all arranged within a 100-mm-square area.

In the comparative example shown in FIG. 12A, since in the image 42a formed by the DMD on the substrate 9, the two directions of arrangement of the irradiation regions corresponding to the micromirrors coincide with the main scanning direction and the sub-scanning direction, the time required for the image 42a of the DMD to move a distance of 2 μm which is the pitch of the writing cells in the main scanning direction is 24 micro seconds, i.e., the shortest time between reset pulses and thus, the travel speed of the substrate 9 is 83.3 mm per second. Accordingly, it takes about 1.2 seconds to expose an area having a length of 100 mm in the main scanning direction. Further, since the length of the image 42a of the DMD in the X direction is about 2 mm, approximately 50 main scans are necessary to expose the whole substrate 9 and it takes about 60 seconds.

In the pattern writing apparatus 1 shown in FIG. 12B, on the other hand, since the image 42b formed by the DMD 42 moves a distance of 4 μm which is twice the pitch P2 of the writing cells 620 in the main scanning direction during the shortest exposure time of 24 micro seconds and thus, the travel speed of the substrate 9 is 166.7 mm per second. From this, the time required to expose an area with a scanning distance of 100 mm is about 0.6 second. Also, since the pitch between the irradiation regions 61 in the X direction is 8 μm, the X direction width of an area that can be exposed by one scan is about 8 mm and thus, 13 main scans are necessary to expose the whole substrate 9. Accordingly, the time required for the pattern writing apparatus 1 to write a pattern on the whole substrate 9 is 7.8 seconds.

As above described, by tilting a two-dimensional array of irradiation regions relative to the main scanning direction, the pattern writing apparatus 1 can achieve high-precision pattern writing by exposure at extremely high speed.

Figure 14:
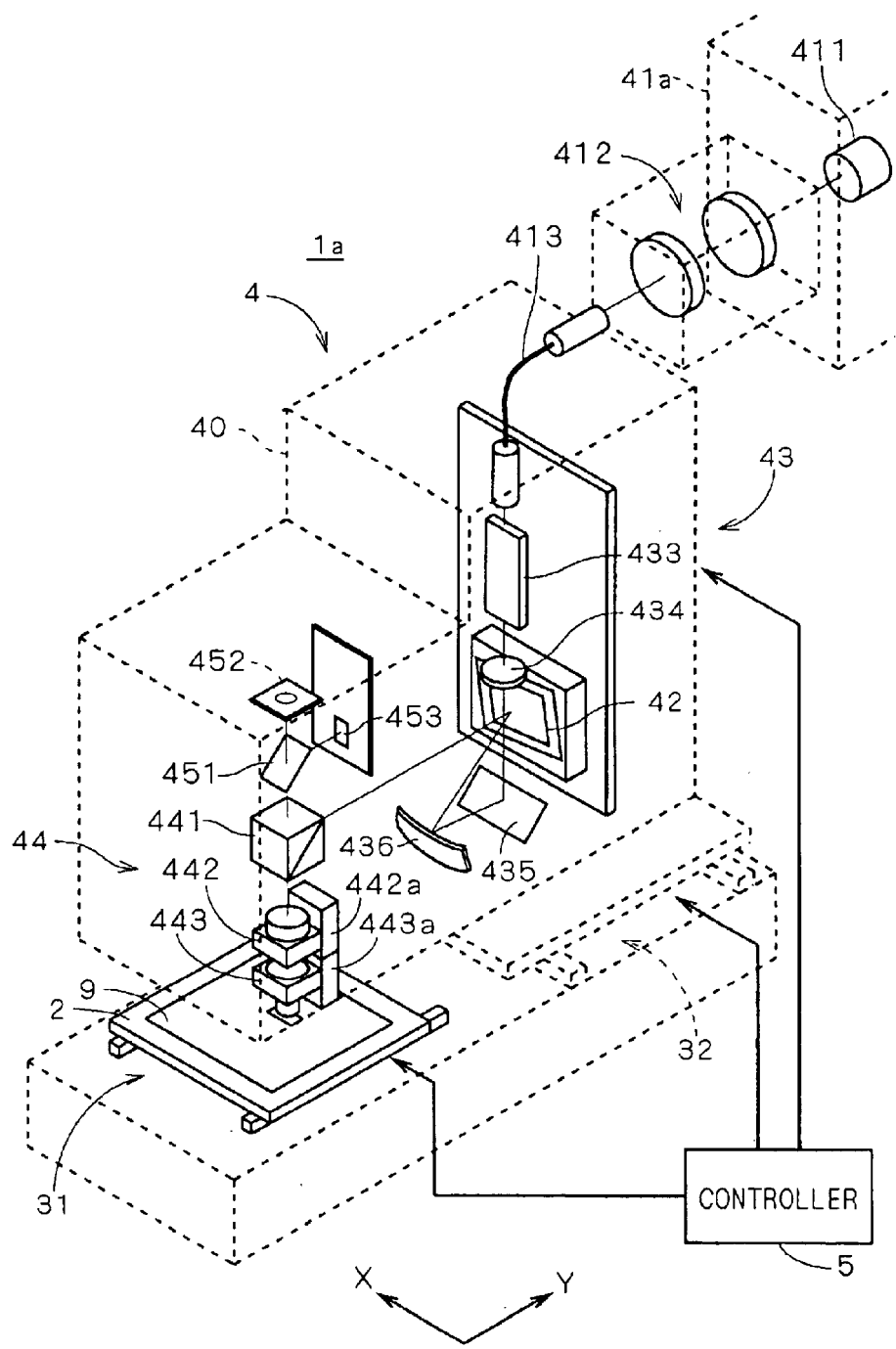
FIG. 14 is a diagram illustrating a general structure of another pattern writing apparatus according to the present invention.

FIG. 14 is a diagram illustrating a structure of a pattern writing apparatus 1a according to a second preferred embodiment of the present invention. The pattern writing apparatus 1a is different from the pattern writing apparatus 1 according to the first preferred embodiment in that the head 40 comprises a light irradiating part 4 connected to a light source unit 41a and that the internal structure of the head 40 is differently configured. The structure of the pattern writing apparatus 1a is identical to that of the pattern writing apparatus 1 according to the first preferred embodiment in all the other respects, and thus the same reference numerals are used to denote the same elements in the first and second preferred embodiments.

The light source unit 41a comprises a high-power LED 411 functioning as a light source and a lens group 412. A light emitted from a lens group 412 is incident upon an optical fiber 413 and then directed to the head 40. The head 40 includes a DMD 42 having a micromirror group arrayed in a lattice arrangement, wherein the micromirror group reflects a light beam from the light source unit 41a to provide a two-dimensionally spatially modulated light beam, in the same manner as described in the first preferred embodiment. In the head 40, a rod integrator 433, a lens 434 and mirrors 435 and 436 constitute an illumination optical system 43 for directing light from the light source unit 41a to the DMD 42. The light is incident upon the DMD 42 at an angle of 24 degrees along a plane which is perpendicular to the DMD 42 and forms an angle of 45 degrees with the column direction of the DMD 42, to uniformly illuminate micromirrors of the micromirror group. For the DMD 42, a DMD of a type which includes 768 rows and 1024 columns of micromirrors is employed, and only the first to 192nd rows of micromirrors are illuminated.

A bundle of modulated light beams (i.e., spatially modulated light beams) generated from only reflected light from part of all the micromirrors of the DMD 42 which are set in a predetermined position (or orientation) corresponding to an ON state enters and is reflected by a cubic beam splitter 441, and is controlled in magnification by a zoom lens 442, to be directed to a projector lens 443. The zoom lens 442 is controlled by an actuator 442a for zooming such that the magnification is variable. The projector lens 443 is controlled by an actuator 443a for auto-focusing (AF) such that focusing can be achieved. The light beam from the projector lens 443 is then directed toward a region on the substrate 9 which is made optically conjugate to the micromirror group, and applied to an irradiation region to which the light beam modulated by each of the micromirrors (and therefore causing modulation) is directed. In the pattern writing apparatus 1a, therefore, the cubic beam splitter 441, the zoom lens 442 and the projector lens 443 constitute a projection optical system 44 for carrying out reduction projection of the light emitted from each of the micromirrors onto a corresponding irradiation region on the substrate 9.

Further, a half mirror 451, a laser diode (LD) 452 for AF and a sensor 453 for AF sensing are disposed above the cubic beam splitter 441. A light emitted from the LD 452 is transmitted through the half mirror 451 and applied to the substrate 9 through the cubic beam splitter 441, the zoom lens 442 and the projector lens 443. Then, the light from the substrate 9 travels in a reverse direction and is reflected by the half mirror 451, to be sensed by the sensor 453. An output of the sensor 453 is used for control of the actuator 443a for AF.

Figure 15:
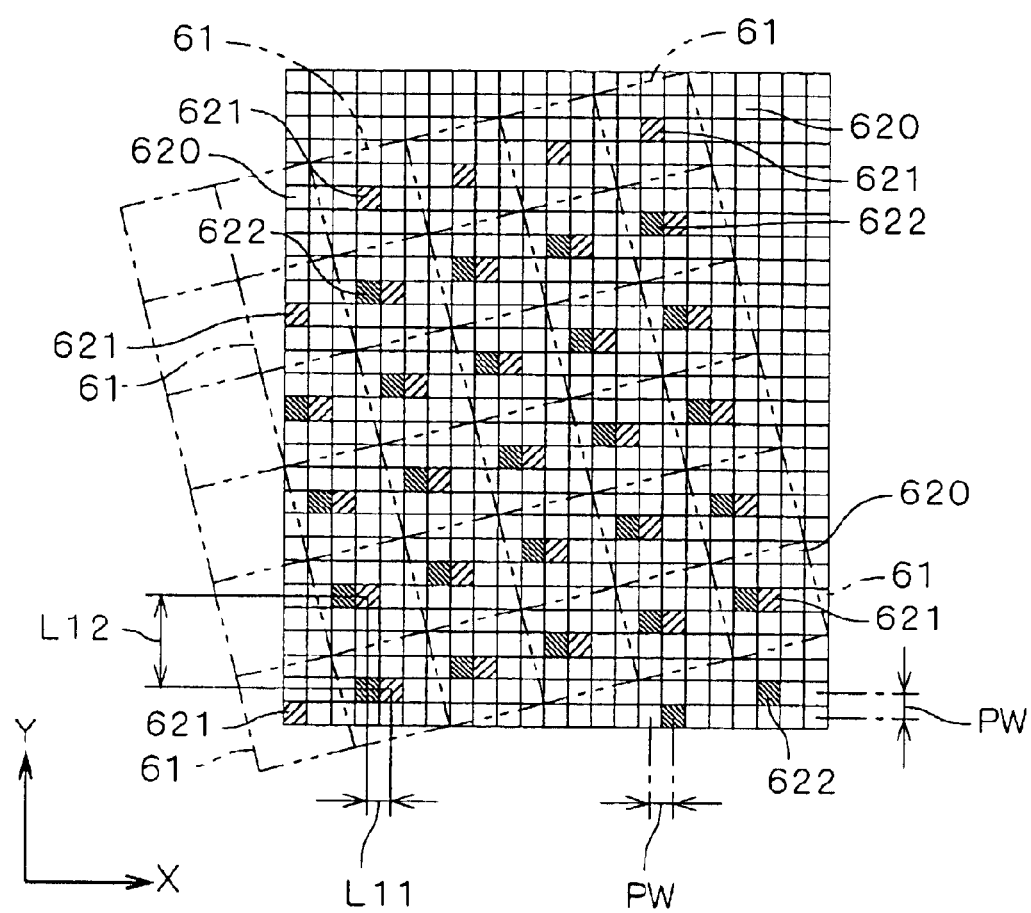
FIG. 15 is a diagram illustrating irradiation regions and writing cells.
Figure 16:
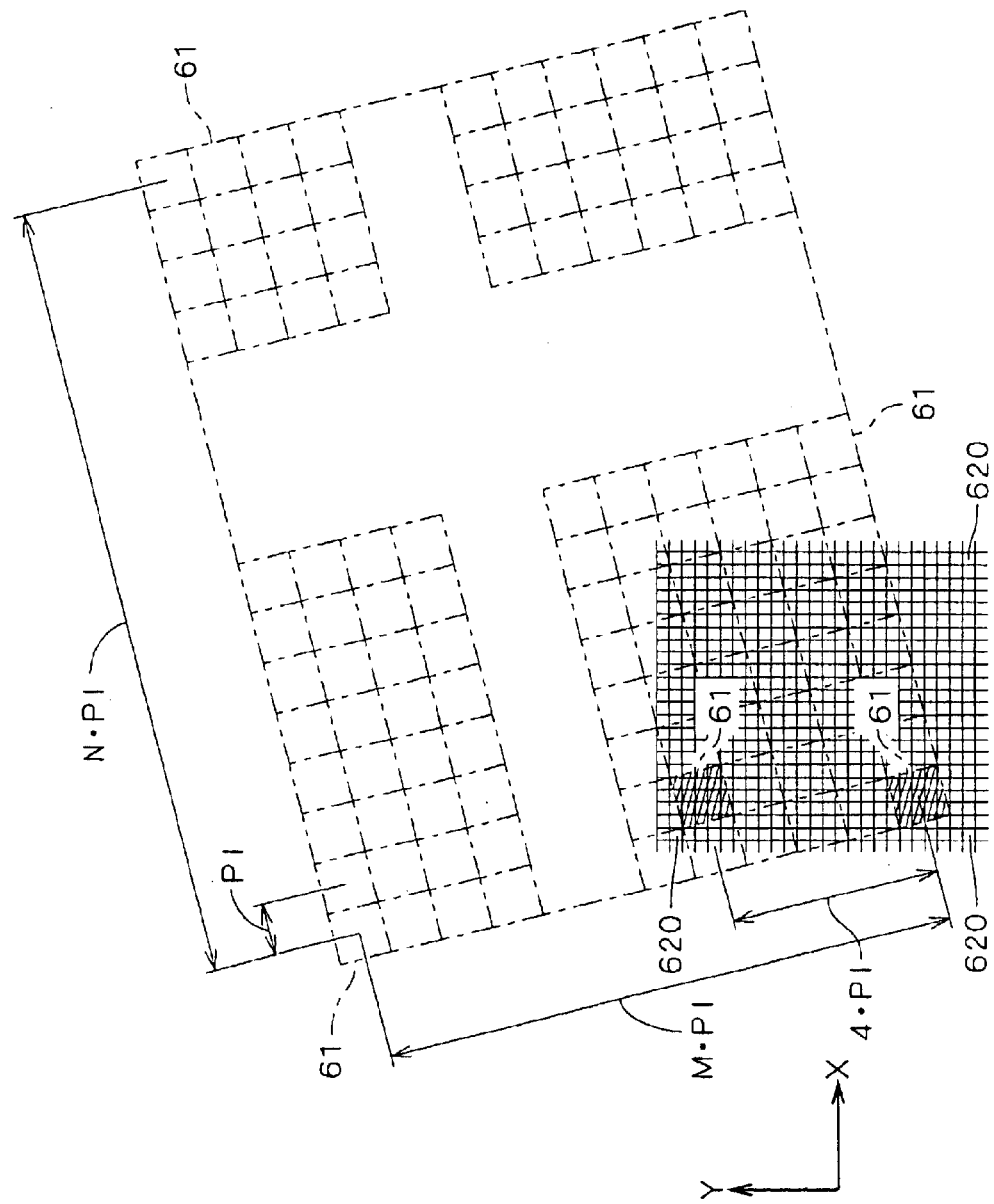
FIG. 16 is a diagram illustrating an overall irradiation region group and a writing cell group.

FIG. 15 is a diagram illustrating the irradiation regions 61 and the writing cells 620 on the substrate 9 in the pattern writing apparatus 1a. FIG. 15 illustrates an example in which arrays of the irradiation region group are tilted in a direction reverse to the direction in the case of the example illustrated in FIG. 4. The writing cells 620 are fixedly arrayed with the same pitch PW (which will hereinafter be referred to as a "writing pitch") in the X direction (sub-scanning direction) and the Y direction (main scanning direction) in FIG. 15. The irradiation regions 61 are arrayed in M rows and N columns along two directions perpendicular to each other with a predetermined pitch PI (which will hereinafter be referred to as an "irradiation pitch"), while corresponding to the micromirrors of the DMD, respectively, as illustrated in FIG. 16.

Referring to FIG. 15, a tilt angle of the irradiation region group relative to the main scanning direction is determined so that: a center-to-center distance L11 along the sub-scanning direction (X direction) between two adjacent irradiation regions 61 arranged in a direction which extends approximately along the main scanning direction (i.e., in the column direction which forms a smaller angle with the main scanning direction) out of the two directions (the row direction and the column direction) of arrangement of the irradiation region group, is equal to the writing pitch PW of the writing cells 620 (a center-to-center distance between adjacent writing cells 620 in the sub-scanning direction); and a center-to-center distance L12 along the main scanning direction (Y direction) between the above-noted two adjacent irradiation regions 61 is four times the writing pitch PW. As indicated by cross-hatching in FIG. 16, one of two adjacent irradiation regions 61 arranged exactly along the main scanning direction is spaced four times the irradiation pitch PI in the column direction and spaced the irradiation pitch PI in the row direction, from the other of the two adjacent irradiation regions 61.

Figure 17:
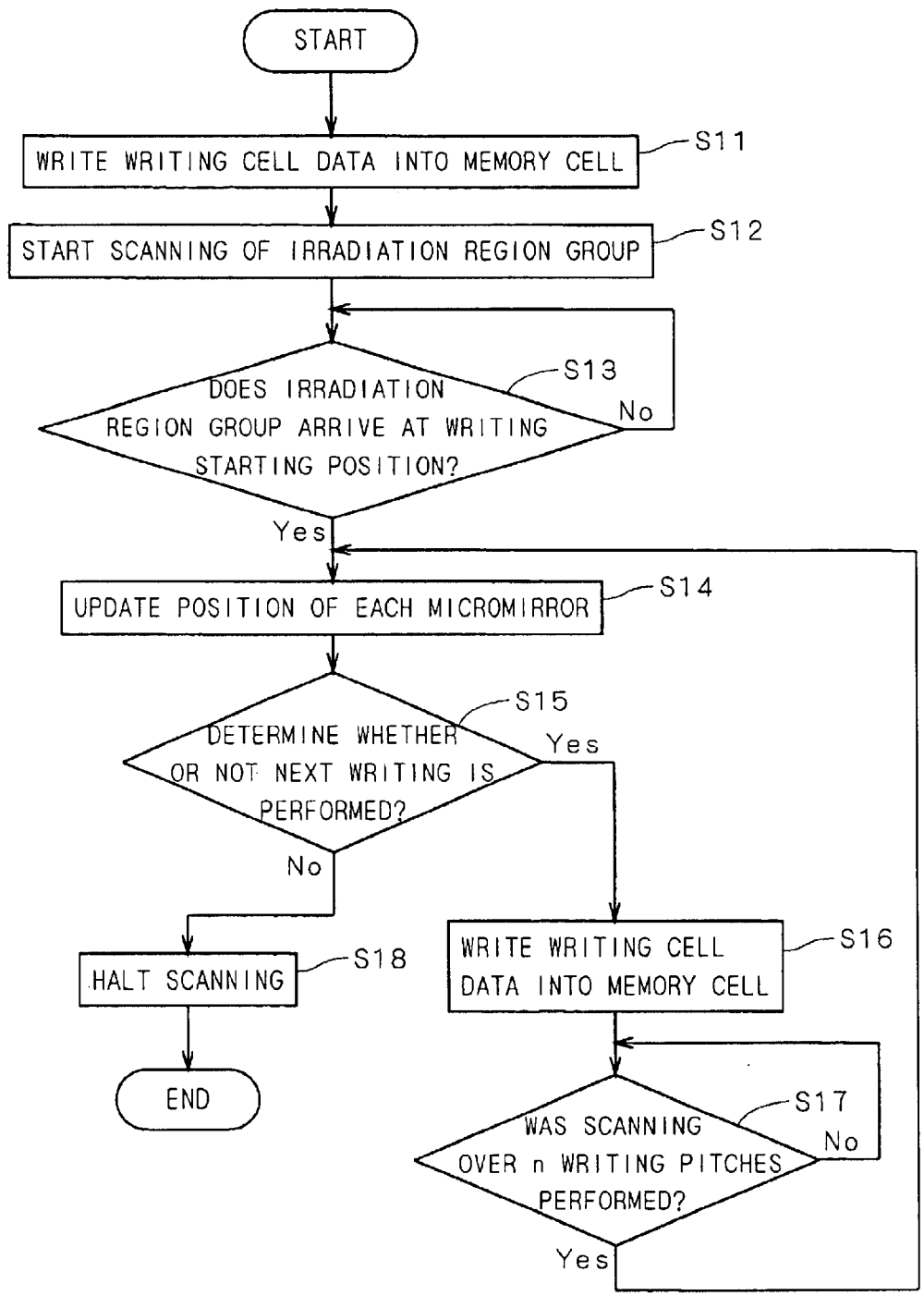
FIG. 17 is a flow chart showing the flow of pattern writing.

Next, the operation of the pattern writing apparatus 1a for writing a pattern on a photoresist film on the substrate 9 is described with reference to FIG. 17. In the following description of the operation of the pattern writing apparatus 1a, the irradiation region group moves relative to the writing cell group in both the main scanning direction and the sub-scanning direction.

At the start of writing, writing cell data to be written into some writing cells which correspond to first locations of the irradiation regions 61 out of all the writing cells 620 (writing cells each indicated by reference numeral 621 which are located at the centers of the respective irradiation regions 61 in FIG. 15, for example) is transmitted from the controller 5 to corresponding memory cells of the respective micromirrors of the DMD 42 (step S11). Subsequently, main scanning of the irradiation region group is started (step S12). When the irradiation region group moves relative to the writing cell group and arrives at a writing starting position where the writing is to be started (step S13), the controller 5 then transmits a reset pulse to the DMD 42, whereby each of the micromirrors is tilted in a position (orientation) responsive to the memory cell data and a first exposure (i.e., ON/OFF control of light irradiation) of the writing cells 621 is performed (step S14).

After the transmission of the reset pulse, writing cell data corresponding to the next writing cells 620 (i.e., the writing cells 622 located on the (−Y) side of the writing cells 621 while being spaced four writing pitches from the writing cells 621, respectively, in FIG. 15 according to the second preferred embodiment) is transmitted to and written into memory cells of the respective micromirrors (step S16). The transmission of a reset pulse to the DMD 42 is performed in synchronization with the operation of the stage moving mechanism 31 for continuously moving the stage 2 in the main scanning direction. When the writing cell group moves a distance equal to four times the writing pitch PW in the main scanning direction after the application of the first reset pulse, the next reset pulse is transmitted to the DMD 42 (steps S17 and S14) and each of the micromirrors is set in a position responsive to the writing cell data. Accordingly, an ON/OFF state of light irradiation of each of the irradiation regions as determined after the application of the first reset pulse is kept unchanged during movement of the writing cell group by the distance equal to four times the writing pitch.

The controller 5 repeats the above exposure operation along with ON/OFF control of light irradiation of the irradiation region group in synchronization with the scanning of the irradiation region group performed by the stage moving mechanism 31, so that exposures centered about the writing cells 621 which have been exposed once are performed again with the eighteenth reset pulse (as counted from the first reset pulse). Immediately before the application of the eighteenth reset pulse (i.e., after application of the seventeenth reset pulse), the operation of the pattern writing is at a stage in which exposure centered about each of seventeen writing cells including the writing cell subjected to the first exposure and sixteen writing cells arranged in the (−Y) direction relative to the writing cell subjected to the first exposure has been performed only once. Below, the above mentioned operation of the pattern writing will be described in more detail with reference to FIGS. 18 through 21.

Figure 18:
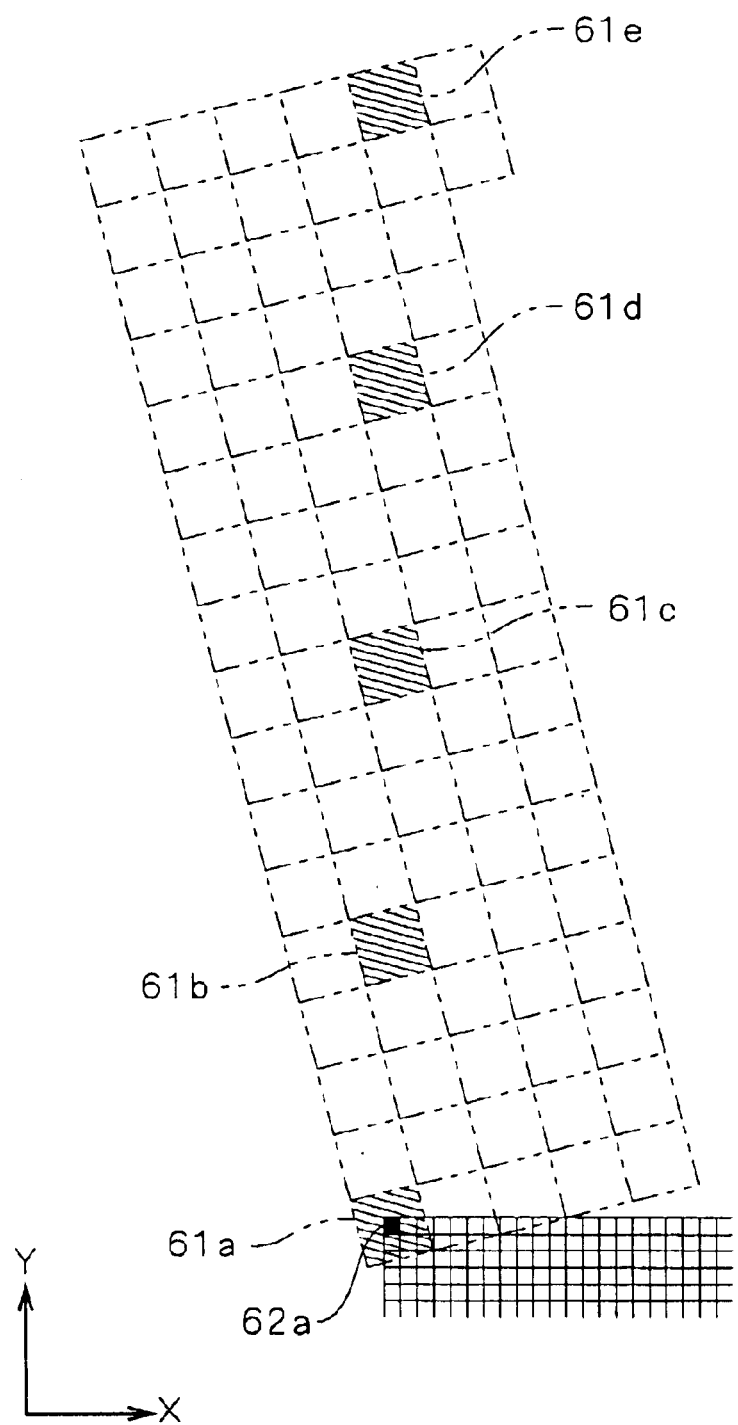
FIGS. 18, 19, 20 and 21 are diagrams illustrating the irradiation regions and the writing cells on which pattern writing is being performed.

FIG. 18 is a diagram illustrating the writing cell group and the irradiation region group. Upon application of the first reset pulse, exposure centered about one of the writing cells 620 in FIG. 18 which is solidly shaded (the one writing cell is indicated by a reference numeral 62a) is performed. In FIG. 18, some of the irradiation regions 61 which are located exactly on the (+Y) side of the writing cell 62a, in other words, some of the irradiation regions 61 each of which is spaced four irradiation pitches in the column direction and spaced one irradiation pitch in the row direction from its adjacent irradiation region, are cross-hatched. Those irradiation regions 61 are indicated by reference numerals 61a, 61b, 61c, 61d and 61e in order of location with respect to the (+Y) direction in FIG. 18.

In the following description, some of the writing cells which are located at respective centers of the irradiation regions 61a, 61b, 61c, 61d and 61e at the time of application of the reset pulse will be indicated by reference numerals 62a, 62b, 62c, 62d and 62e. Also, for ease of understanding, a position of the writing cell 62a which is located at the center of the irradiation region 61a at the time of the first exposure is represented by using coordinates, as C(0, 0), and a position of the writing cell on the (−Y) side of the writing cell 62a is represented as C(0, 1). In an analogous manner, positions of the irradiation regions 61a, 61b, 61c, 61d and 61e are represented by using a coordinate system formed of axes along the row and column directions, as R(0, 0), R(1, 4), R(2, 8), R(3, 12) and R(4, 16), respectively. Such representation using coordinates will be additionally provided in the following description as needed.

Figure 19:
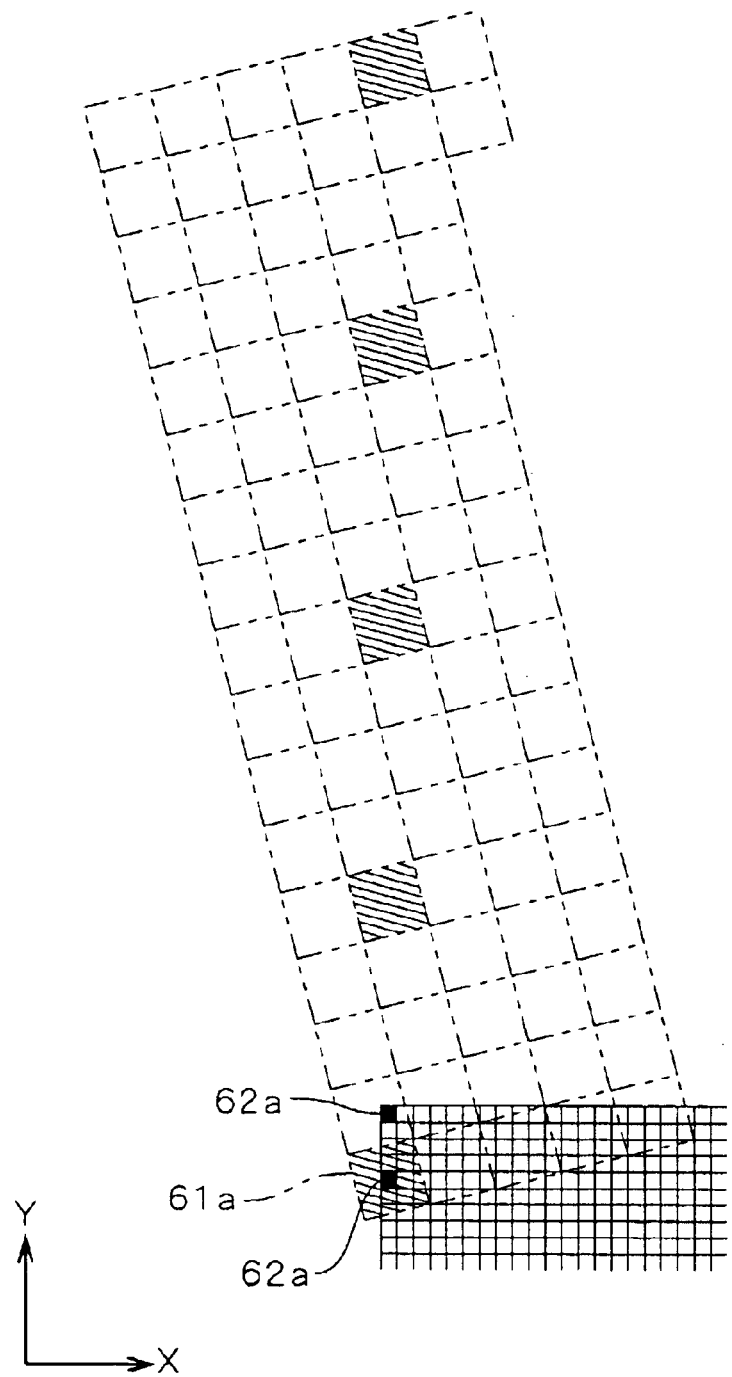
Figure 20:
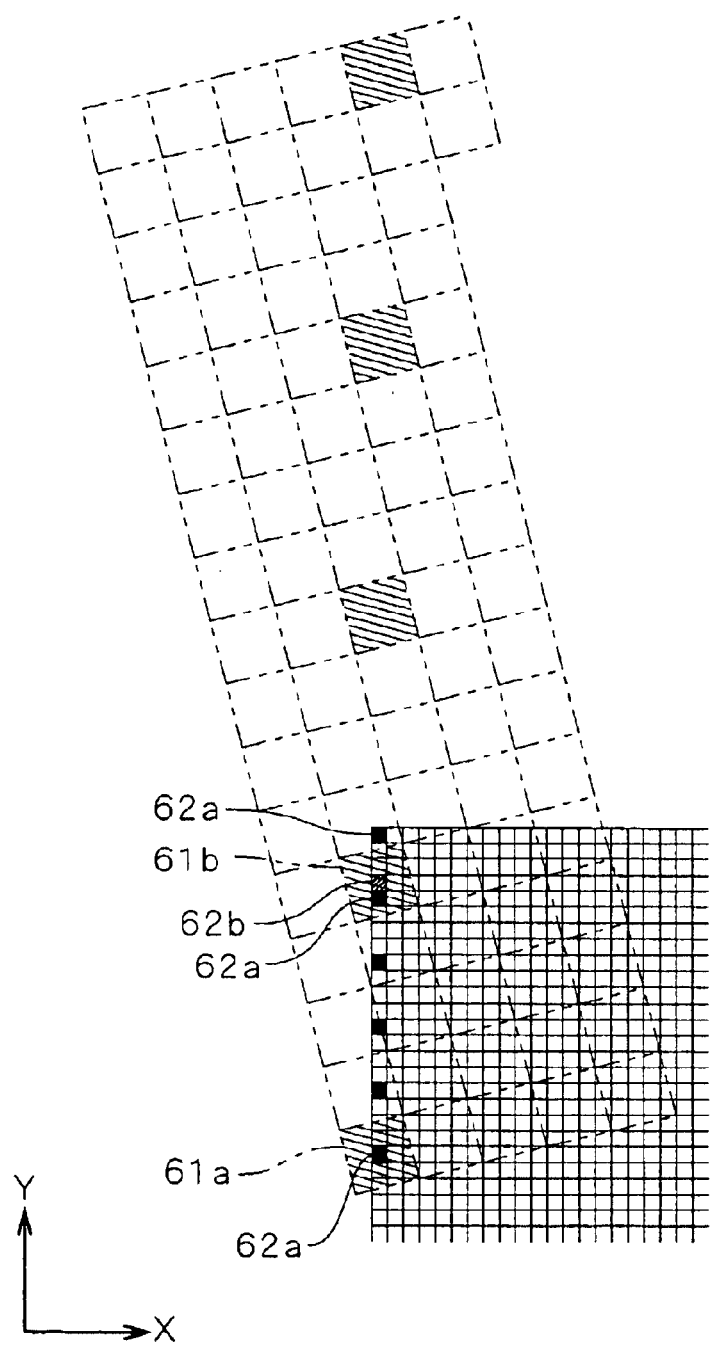

FIG. 19 is a diagram illustrating the writing cell group and the irradiation region group when the second reset pulse is transmitted to the DMD 42. The exposure state of each of the irradiation regions as determined after application of the first reset pulse (ON/OFF of light irradiation of each of the irradiation regions) is maintained until the irradiation region group moves a distance equal to four times the writing pitch relative to the writing cell group. When the second pulse is applied, exposure centered about another writing cell 62a (C (0, 4)) which is spaced four times the writing pitch in the (−Y) direction from the first writing cell 62a (C (0, 0)) is performed. FIG. 20 illustrates a state after the sixth reset pulse is applied. Specifically, exposure of the irradiation region 61a centered about the writing cell 62a (C(0, 20)) which is located on the (−Y) side is performed, and also exposure of the irradiation region 61b (R(1, 4)) centered about the writing cell 62b (C(0, 3)) spaced three writing pitches in the (−Y) direction from the writing cell 62a (C(0, 0)) which is located in the (+Y) direction relative to any other writing cell is performed. Subsequently, exposure centered about the writing cell spaced three writing pitches in the (−Y) direction from one of the writing cells 62a in the irradiation region 61b each time the irradiation region group moves a distance equal to four times the writing pitch.

Figure 21:
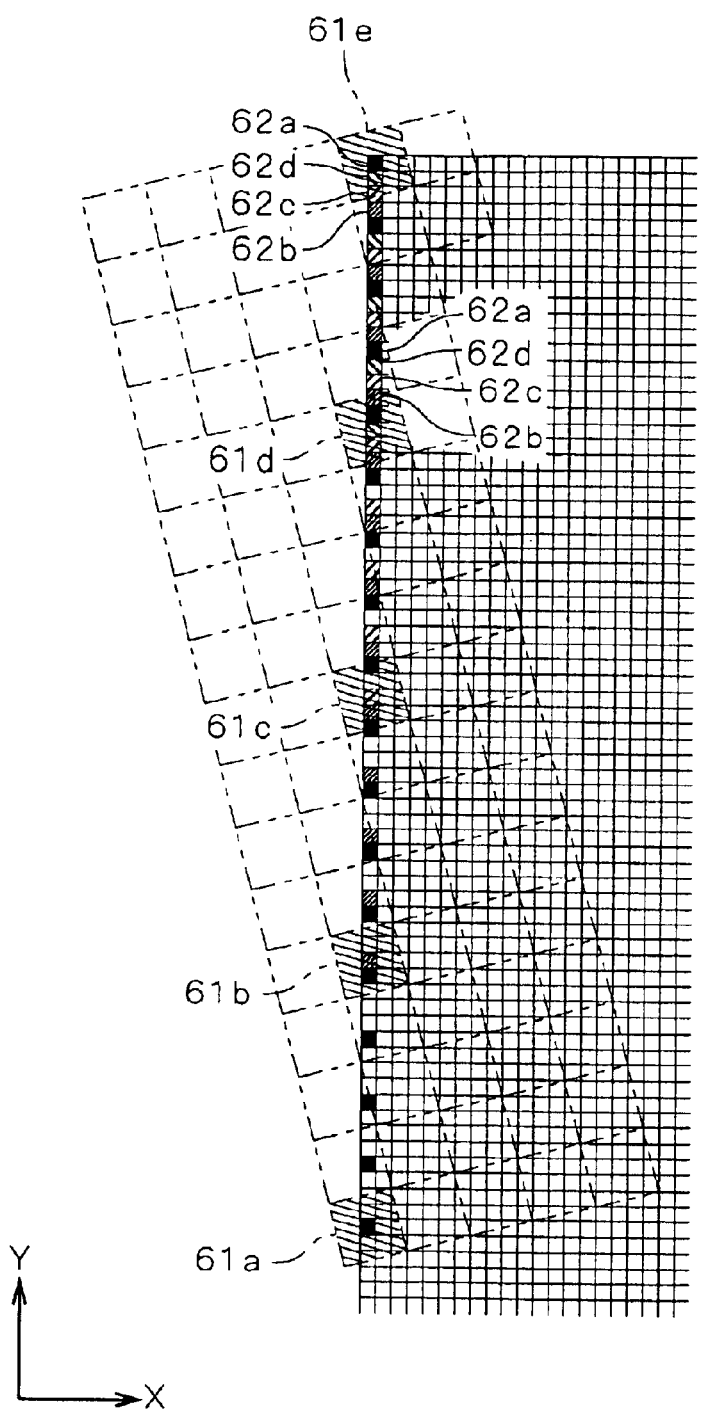

FIG. 21 is a diagram illustrating a state immediately after the eighteenth reset pulse is transmitted to the DMD 42. When the irradiation region group moves in the (−Y) direction relative to the writing cell group as illustrated in FIG. 21, exposures centered about the writing cells each located between two of the plurality of writing cells 62a about which the exposures have been centered in the irradiation region 61a located at the end in the (−Y) direction are performed in the irradiation regions 61b, 61c and 61d. As a result, looking at a part on the (+Y) side in the column located at the edge in the (−X) side of the writing cell group in FIG. 21, for example, the four writing cells 62a, 62d, 62c and 62b on which the exposures have been performed in the irradiation regions 61a, 61d, 61c and 61b are aligned in the (−Y) direction in the order of the occurrence in this sentence. Thus, immediately before the application of the eighteenth reset pulse, the operation of the pattern writing is at a stage in which exposure centered about each of seventeen writing cells, including the writing cell 62a (C(0, 0)) subjected to the first exposure and sixteen writing cells arranged in the (−Y) direction relative to the writing cell 62a, has been performed only once.

Then, exposure of the irradiation region 61e (R(4, 16)) centered about the writing cell 62a (C(0, 0)) located at the end in the (+Y) direction is performed in synchronization with the eighteenth reset pulse. Thereafter, in synchronization with subsequent reset pulses, respective exposures centered about the writing cells which have ever been subjected to exposure once are sequentially performed again in irradiation regions located in the (+Y) direction relative to the irradiation regions illustrated in FIG. 21, so that each of the writing cells is exposed twice. Further, exposure is repeated so that each of the writing cells is exposed three times and more. The cycle of repetitive exposures is seventeen reset pulses.

The above described repetitive exposures can be represented using coordinates as follows. At the time of application of the reset pulse, the writing cell 620 represented as C(0, 4k) (k is an integer equal to or larger than 0) is located at a center of the irradiation region 61 represented as R(m, 4m (m=0, 4, 8, 12 ... 44)). The writing cell 620 represented as C(0, 4k+1) is located at a center of the irradiation region 61 represented as R(m, 4m (m=3, 7, 11, 15 ... 47)), while the writing cells 620 represented as C(0, 4k+2) and C(0, 4k+3) are located at centers of irradiation regions 61 represented as R(m, 4m (m=2, 6, 10, 14 ... 46)) and R(m, 4m (m=1, 5, 9, 13 ... 45), respectively.

By repeating the above operation, in the pattern writing apparatus 1a, in a case where the DMD 42 comprised of M rows of micromirrors is employed, the plurality of irradiation regions 61 are caused to move relative to the writing cells 620 on the substrate 9 by the stage moving mechanism 31 so that exposure is performed (M/16) times, thereby permitting control of a light amount centered about each of the writing cells 620 with a (M/16)-step gradation. Actually, M is set to 192 and control of exposure is performed twelve times. As a matter of course, the size of each of the irradiation regions 61 is large enough to cover a plurality of writing cells 620 as illustrated in FIG. 15, and the writing cell group moves a distance equal to four times the writing pitch while a state of exposure is kept unchanged between two reset pulses. Accordingly, it is impossible to achieve light irradiation with a (M/16)-step gradation accurately. However, the minimum pattern linewidth to be written (i.e., pattern resolution) is usually set to be much greater than the smallest controllable unit of linewidth (i.e., linewidth accuracy), and the operation is controlled such that light is applied to some of the writing cells 620 which exist continuously with one another while no light is applied to other ones of the writing cells 620 which exist continuously with one another. Hence, there is no problem in practice.

After the writing which should be performed in a time period during which the main scanning of the irradiation region group is performed once is finished (refer to FIG. 17, step S15), the main scanning is halted (step S16). Then, in a case where another main scanning is performed, subscanning of the irradiation region group in the X direction is performed by the head moving mechanism 32 and the operation is returned back to the step S11, where the stage 2 is moved in a reverse direction ((-Y) direction) by the stage moving mechanism 31, to initiate next writing.

As described above, in the pattern writing apparatus 1a, the writing cell group moves a distance equal to four times the writing pitch between reset pulses, so that writing is performed at a speed which is four times as high as the speed of the writing in which the writing cell group moves a distance equal to one writing pitch between reset pulses (it is noted that the above described operation of the pattern writing will hereinafter referred to as a "quad (4)-speed writing"). As a result, it is possible to perform writing at a higher speed while controlling the linewidth of the pattern.

In the meantime, it is required that the number of the writing pitches between the irradiation regions 61 and the number of the writing pitches equal to a distance which the writing cell group moves between reset pulses be relatively prime (, that is, the greatest common divisor of those numbers is 1), in order to ensure exposures of the irradiation regions 61b, 61c and 61d respectively centered about the writing cells located between two writing cells 62a (solidly shaded in FIG. 21) which are spaced four times the writing pitch from each other, in other words, in order to perform exposure centered about each of the writing cells. In a situation illustrated in FIG. 21, the number of the writing pitches between the irradiation regions 61 is seventeen and the number of the writing pitches equal to the distance which the writing cell group moves between reset pulses is four. Thus, the numbers of the writing pitches are relatively prime (i.e., coprime). Further, since the number of the writing pitches between the irradiation regions 61 is seventeen, the writing speed can be arbitrarily varied from 2-speed to 16-speed under the condition that the number of rows of the irradiation regions 61 is sufficiently large.

Figure 22:
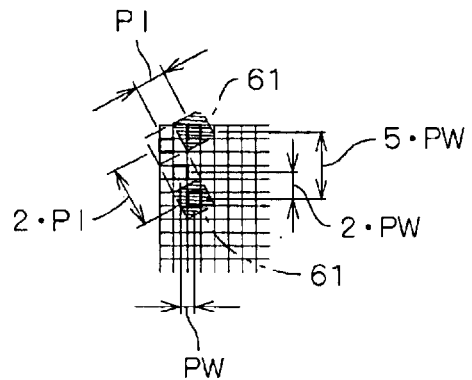
FIGS. 22, 23, 24 and 25 are diagrams showing a relationship between a tilt angle of the irradiation region group and a size of each irradiation region.
Figure 23:
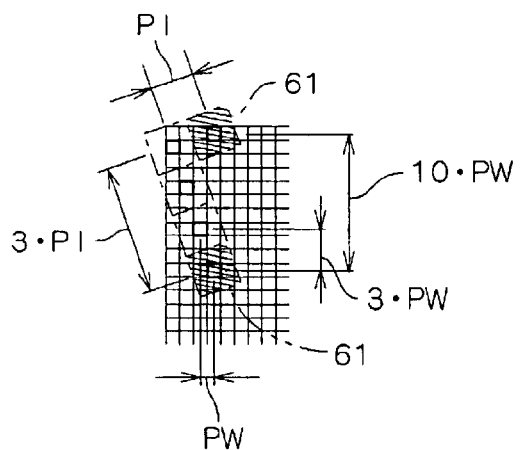
Figure 24:
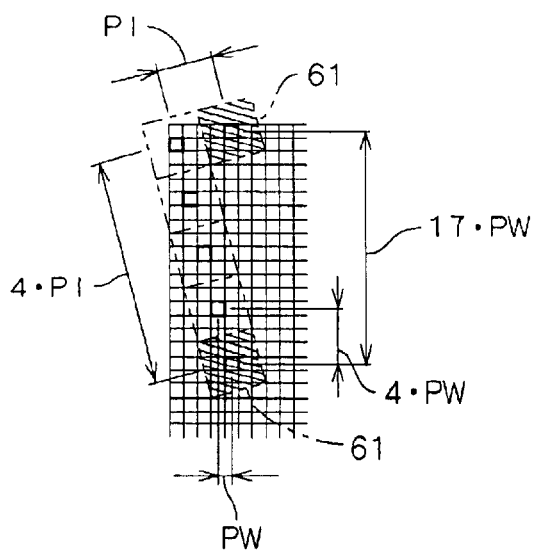
Figure 25:
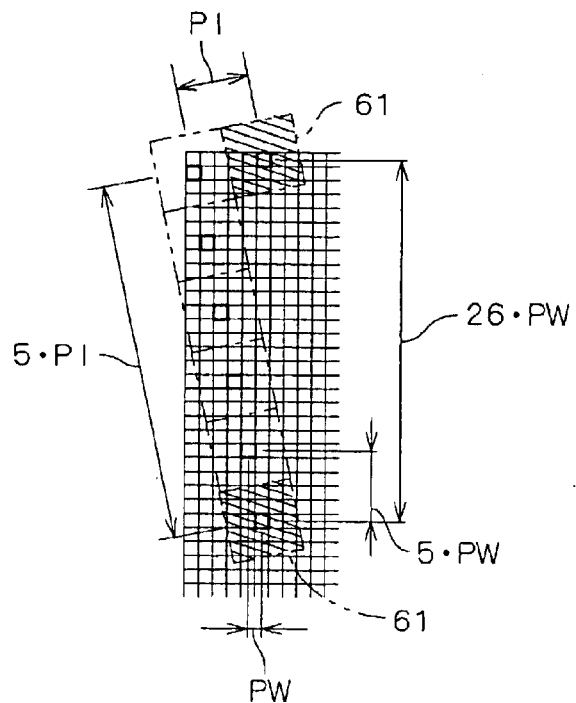

FIGS. 22, 23, 24 and 25 are diagrams showing a relationship between the tilt angle of the irradiation region group and the size of each of the irradiation regions 61. It is shown in FIG. 22 that two irradiation regions 61 arranged along the scanning direction are spaced twice the irradiation pitch PI in the column direction and are spaced the irradiation pitch PI in the row direction, from each other. It is shown in FIGS. 23, 24 and 25 that two irradiation regions 61 arranged along the scanning direction are spaced three times the irradiation pitch PI, four times the irradiation pitch PI and five times the irradiation pitch PI from each other in the column direction, respectively, while being spaced the irradiation pitch PI from each other in the row direction. In examples shown in FIGS. 22 to 25, each of the irradiation regions 61 and the writing cells 620 is in the shape of a square. Also, a center-to-center distance along a direction perpendicular to the scanning direction between two adjacent irradiation regions 61 arranged in a direction which extends approximately along the scanning direction (i.e., column direction) out of the two directions of arrangement of the irradiation region group, is equal to the writing pitch PW in each of the examples in FIGS. 22 to 25, and a center-to-center distance along the main scanning direction between the above-noted two adjacent irradiation regions 61 is twice, three times, four times and five times (hereinafter referred to as "a times" wherein "a" is an integer equal to 2 or more) the writing pitch PW in the examples shown in FIGS. 22 to 25, respectively.

On the other hand, in the examples shown in FIGS. 22 to 25, the distance between two irradiation regions 61 arranged exactly along the scanning direction is five times, ten times, seventeen times and twenty-six times (generalized as "$a^2+1$ times") the writing pitch, respectively. Accordingly, in the examples shown in FIGS. 22 to 25, the writing can be performed at a speed increased by a given-number times, where the given number is a positive integral which is relatively prime to the number of 5, 10, 17 or 26, respectively. More specifically, 2-, 3- or 4-speed writing, 3-, 5-, 7- or 9-speed writing, 2-, 3-, 4-, 5- ... speed writing, and 3-, 5-, 7-, 9- ... speed writing can be achieved in the examples shown in FIGS. 22, 23, 24 and 25, respectively. That is, when ($a^2+1$) and n are relatively prime, high-resolution n-speed writing for exercising ON/OFF control of light irradiation once in a time period during which the irradiation region group is caused to move a distance equal to n times the writing pitch PW relative to the writing cell group by the controller 5 can be appropriately performed.

At that time, each of the writing cells 620 moves from one of the irradiation regions 61 to a center of another irradiation region 61 which is (a×n) times the irradiation pitch PI distant from the one irradiation region 61 in the row direction and n times the irradiation pitch PI distant from the one irradiation region 61 in the column direction, with each of ($a^2+1$) reset pulses. Accordingly, in a case where the irradiation region group has M rows, in other words, the number of the irradiation regions 61 arranged in the direction approximately along the main scanning direction is M, providing that M is an integral multiple of (a×n), exposure is repeated a certain number of times to each of the writing cells 620 arranged in the column direction (excluding some of the writing cells over which end portions on the (±X) side in the irradiation region group pass) when the irradiation region group passes over the writing cell group.

It is noted that double-speed writing (double-speed mode operation) described above with reference to FIGS. 10A to 10D is equivalent to a case where n is 2. To perform writing at a speed higher than the speed of the double-speed writing would require that n is equal to or larger than 3. In a situation writing is intended to be performed on a resist film on a substrate, it is preferable to set the value of n to 4, for example, taking into consideration properties of the material, the size of each of the irradiation regions 61 and the like.

Also, in performing n-speed writing, the number of exposures to be repeated is (M/(a×n)) (with fractions after the decimal point dropped). In contrast thereto, in performing 1-speed writing in which a reset pulse is transmitted to the DMD each time the writing cell group relatively moves the writing pitch PW, exposure can be repeated (M/a) times. However, because of the fact that it is unnecessary to repeat exposure (M/a) times in most practical cases, n-speed exposure can be regarded as a technique for repeating high-speed writing the minimum number of times with the use of the maximum number of micromirrors out of micromirrors included in the DMD 42.

In the meantime, as shown in FIGS. 22 to 25, as the tilt angle of the columns of the irradiation region group with respect to the main scanning direction decreases, the size of each of the irradiation regions 61 increases relative to the size of each of the writing cells 620. Conversely, it can be considered that when the size of each of the irradiation regions 61 is constant, it is possible to make each of the writing cells 620 smaller by decreasing the tilt angle of the columns of the irradiation region group with respect to the main scanning direction. The length of a single side of each of the irradiation regions 61 is equal to a value obtained by multiplying the writing pitch PW by a square root of ($a^2+1$). For example, when light is applied to one of the irradiation regions 61 between two reset pulses in quad-speed writing in which n is set to 4, respective cumulative amounts of light applied to portions of the one irradiation region 61 on lines 631 and 632 in FIG. 26 have distributions indicated by lines 641 and 642. As shown, light is applied to a wider range as compared to the size of each of the writing cells 620, in particular, the dimension of each of the writing cells 620 along the main scanning direction. Then, to stack the distributions of light amount shown in FIG. 26 by ON/OFF control of light irradiation results in a distribution of optical energy supplied to the photosensitive material on the substrate 9. By using the distribution of optical energy, the pattern writing can be accomplished.

Figure 27A:
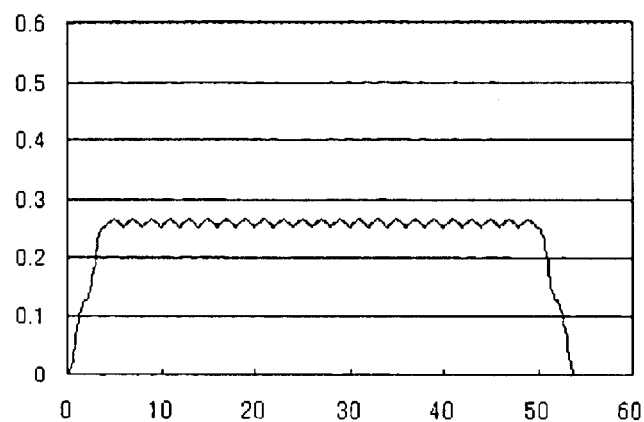
FIG. 27A through 27G are diagrams showing cumulative amounts of light exhibited in respective cases where light irradiation is alternately ON and OFF every one, two, three, four, five, six and eight writing pitches.
Figure 27B:
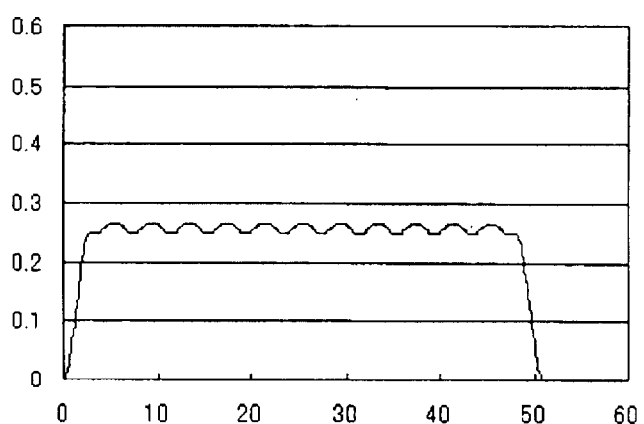
Figure 27C:
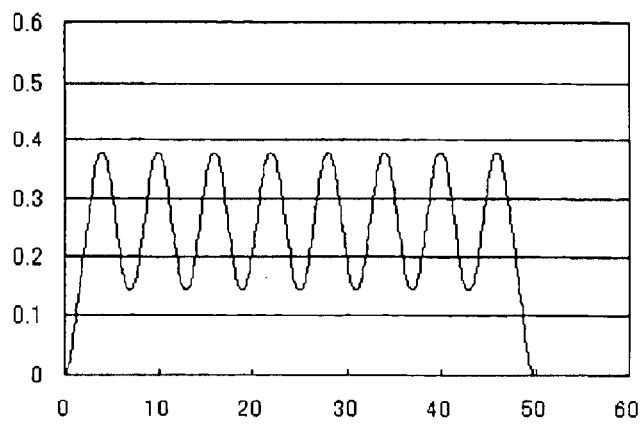
Figure 27D:
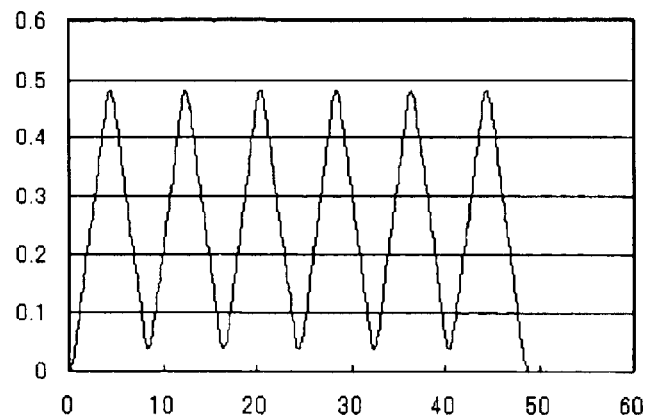
Figure 27E:
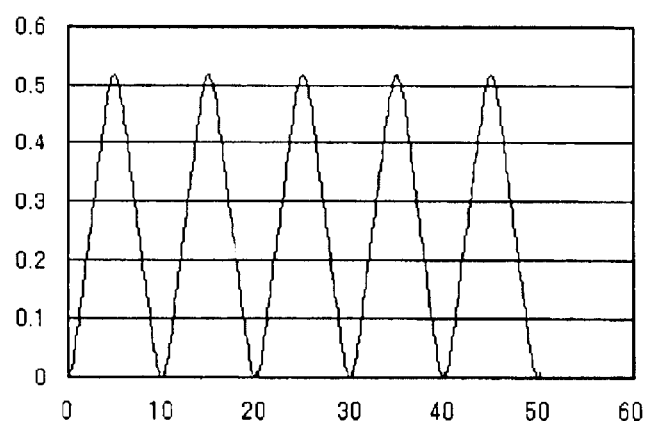
Figure 27F:
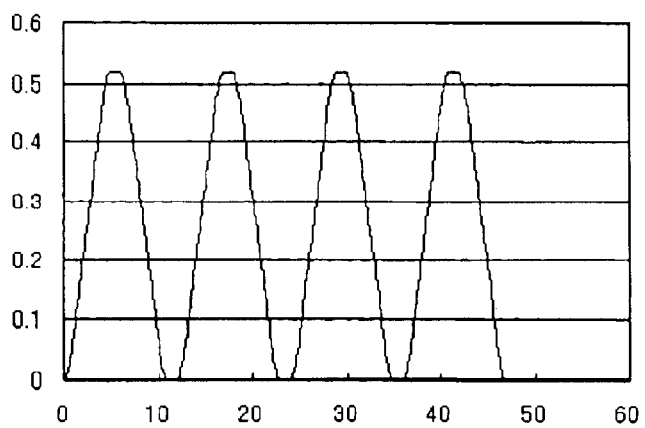
Figure 27G:
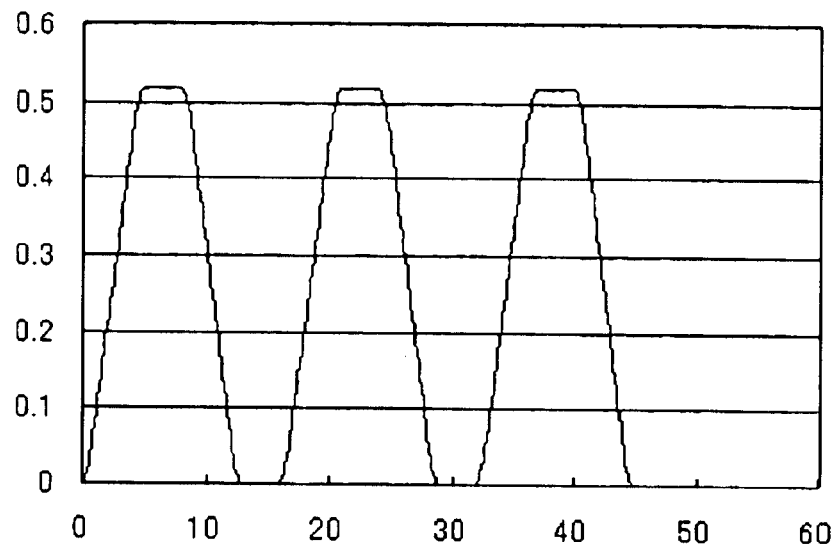

FIG. 27A shows a cumulative amount of light along the main scanning direction in a case where light irradiation is controlled to be alternately ON and OFF each time the irradiation region group moves one writing pitch. FIGS. 27B to 27G show cumulative amounts of light in cases where light irradiation is controlled to be alternately ON and OFF each time the irradiation region group moves twice the writing pitch, three times the writing pitch, four times the writing pitch, five times the writing pitch, six times the writing pitch and eight times the writing pitch, respectively. It is appreciated from FIGS. 27A through 27G that as a distance of the movement of the irradiation region group while light irradiation is kept ON or OFF increases, in other words, as a width of a written line extending along the sub-scanning direction increases, a peak of the distribution of cumulative amount of light becomes higher and a valley thereof becomes lower. Because of a generally known property of a photoresist material which senses light upon application of light in an amount larger than a predetermined amount, it can be considered that a pattern with a predetermined linewidth can be written by maintaining either ON-state or OFF-state for a certain period of time.

However, there is a kind of photoresist which requires application of a considerable amount of light to sense light. In a case where such kind of photoresist is employed, a pattern with a predetermined linewidth can be written by adjusting the intensity of light emitted from a light source, as well as adjusting a timing of ON/OFF control of light irradiation. For example, in writing a pattern on a photoresist such as silver halide in an image setter, it would be sufficient if light in the minimum amount that is required for the photosensitive material to sense the light is applied to the photosensitive material, because an objective of pattern writing is attained by causing the photosensitive material to sense the light. In contrast thereto, in writing a pattern on a photoresist on a substrate formed of a semiconductor or the like, it is necessary to apply light in an amount larger than an amount required for the photoresist to sense the light, in order to prevent the photoresist from being stripped off or excessively removed in an etching process which is later carried out.

Figure 28:
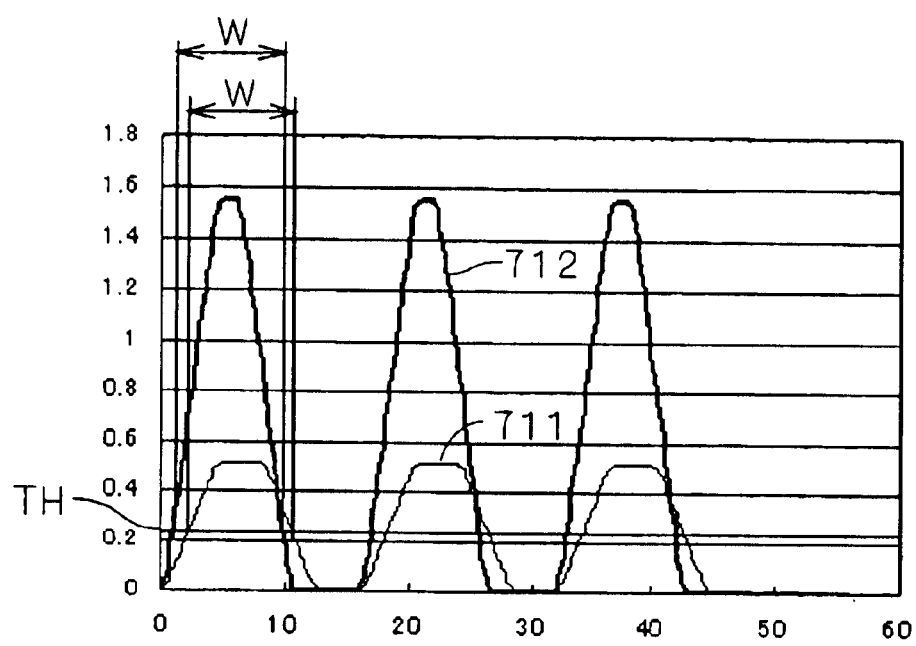
FIG. 28 is a diagram showing a cumulative amount of light exhibited with the light intensity being differentiated.

In the latter situation, a distribution of cumulative amount of light indicated by a thick line 712 in FIG. 28 which is obtained by enhancing the light intensity so that the light irradiation is alternately ON for six writing pitches and OFF for ten writing pitches is supplied to a photosensitive material. This makes it possible to obtain a pattern with a linewidth W to which a sufficient amount of light is applied even in a case where the photosensitive material can be caused to sense the light with the linewidth W with reference to a threshold value TH by supplying a distribution of cumulative amount of light indicated by a thin line 711 in FIG. 28 which is obtained by controlling light irradiation such that the light irradiation is alternately ON and OFF every eight writing pitches.

Figure 26:
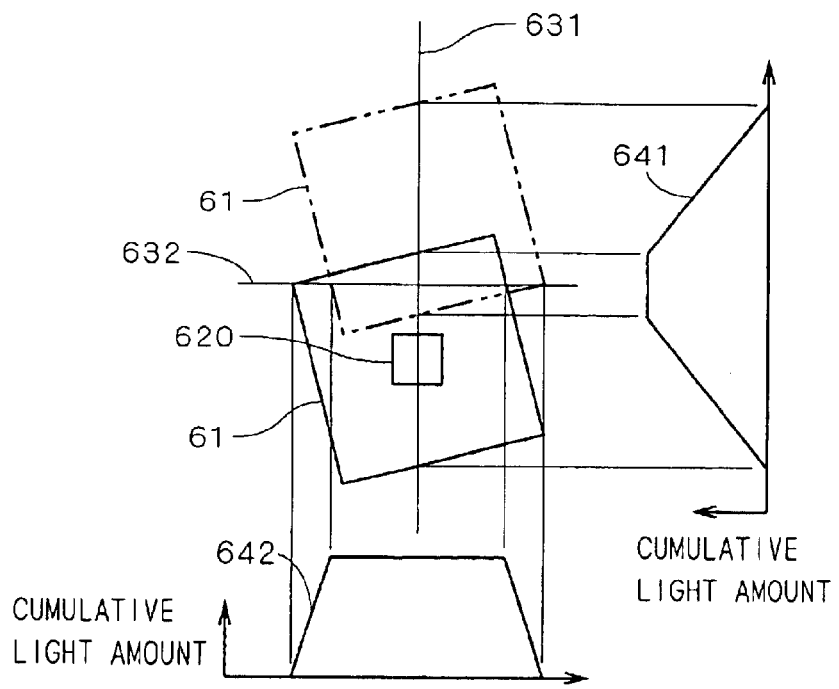
FIG. 26 is a diagram showing cumulative amounts of light.

It is noted that, in the pattern writing apparatus 1a, the irradiation regions 61 each of which is larger in size than each of the writing cells 620 are used as above described, to thereby widen the distribution of light amount in both the main scanning direction and the sub-scanning direction to some extent. Additionally, by performing high-speed writing, the distribution of light amount is further widened in the main scanning direction as shown in FIG. 26. If the linewidth of a pattern to be written is sufficiently large, a high accuracy of the linewidth along the main scanning direction can be maintained by appropriately combining choice of the light intensity with ON/OFF control of light irradiation as described above. However, in handling the minimum writable linewidth, i.e., the minimum resolution, degradation of the accuracy of the linewidth along the main scanning direction is more unavoidable than that of the linewidth along the sub-scanning direction.

Figure 29:
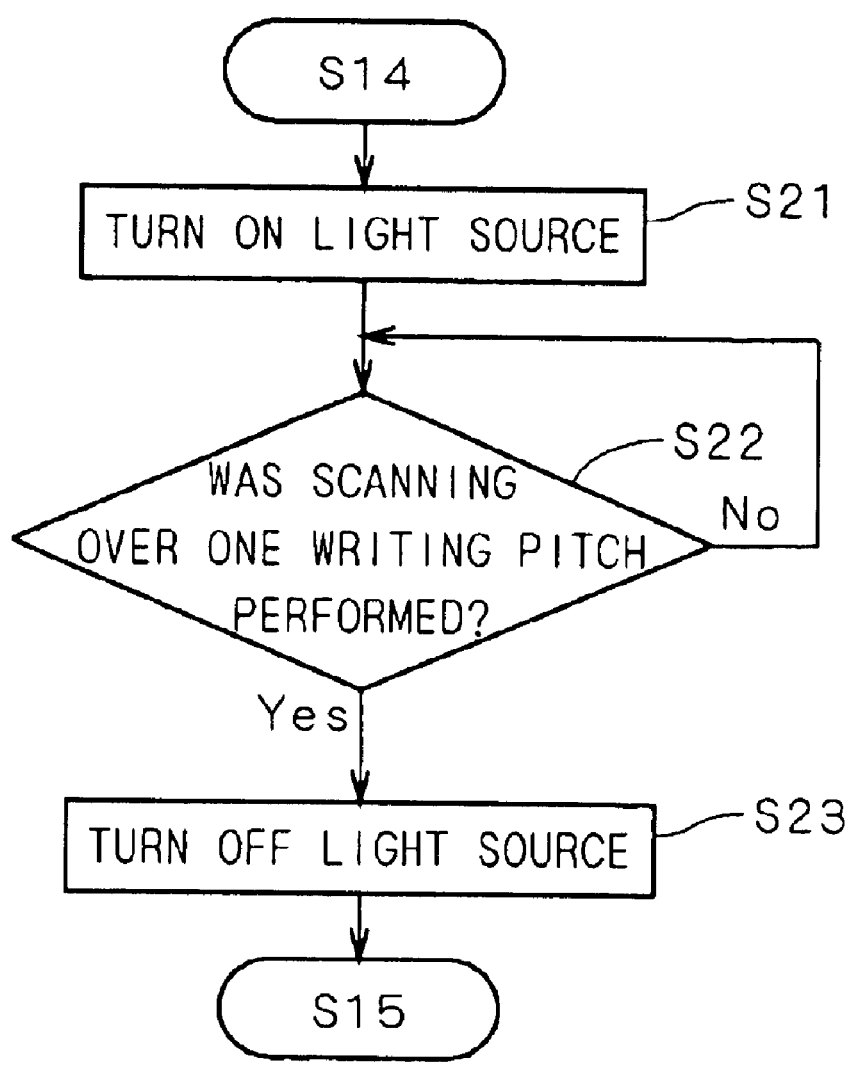
FIG. 29 is a flow chart showing the flow of ON/OFF control of light source.

To improve the above noted matter, the pattern writing apparatus 1a is configured such that also control for momentarily turning off the LED 411 functioning as a light source at some midpoint in a time period during which the writing cell group is moving n writing pitches can be exercised. To exercise ON/OFF control (i.e., modulation) of the LED 411, the steps S21, S22 and S23 shown in FIG. 29 are performed between the steps S14 and S15 in the operation of the pattern writing apparatus 1*a* which is shown in FIG. 17. In modulation of the LED 411, immediately after the position of each of the micromirrors is updated in the step S14, the LED 411 is turned on to light up (step S21). Then, when the writing cell group moves the writing pitch PW (step S22), the LED 411 is turned off (step S23). Thereafter, when next writing data is written into the memory cells (step S16) so that the writing cell group moves a distance equal to n times the writing pitch PW from a position where the writing cell group was located at the preceding reset pulse (step S17), the operation is returned back to the step S14.

As a result of the above described operation, the light irradiation region group moves the writing pitch PW relative to the writing cell group in a time period from a time when light irradiation of the irradiation regions 61 is controlled to be ON to a time when light irradiation of the irradiation regions 61 is controlled to be OFF, and a duration of light irradiation of the irradiation regions 61 is limited to 1/n times an interval between reset pulses. As a result, it is possible to perform high-speed writing while suppressing expansion of light irradiation in the main scanning direction to the same extent as that of light irradiation in the sub-scanning direction.

When an LED or LD is employed as a light source, ON/OFF control of the light source can be achieved at a speed equal to or higher than ten times the maximum modulation speed of the DMD 42. Accordingly, even in performing 8-speed writing (n=8), it is possible to perform writing easily while suppressing degradation of resolution in the main scanning direction. In this case, an amount of optical energy supplied to the photosensitive material between reset pulses is reduced to one eighth, so that the intensity of light emitted from the light source is enhanced and a material which is highly sensitive can be employed as the photosensitive material.

The preferred embodiments of the present invention has been described, but it should be understood that the present invention is not limited to the aforementioned preferred embodiments and various modifications are possible.

The spatial light modulator employed in the pattern writing apparatus 1 or 1*a* is not limited to the DMD 42 employed in the aforementioned preferred embodiments; in fact, it may be a liquid crystal shutter, for example. Also, pattern writing may be achieved by arranging, for example, a plurality of light emitting diodes in two dimensions as a light source, tilting the direction of arrangement of an irradiation region group corresponding to the light emitting diode group relative to the main scanning direction, and exercising ON/OFF control of each of the light emitting diodes in synchronization with relative movement of the irradiation regions.

In ON/OFF control of the light source illustrated in FIG. 29, the light source is not necessarily required to be turned OFF at a time when the irradiation region group moves one writing pitch PW. For example, when a cumulative amount of light must be sufficient, the light source may be turned OFF at a time when the irradiation region group moves a distance equal to twice the writing pitch PW. That is, the timing of turning off the light source can be arbitrarily determined, providing that light irradiation of the irradiation regions 61 is controlled to be OFF before relative movement of the irradiation region group by a distance equal to n times the writing pitch PW is finished after the light irradiation of the irradiation regions 61 is controlled to be ON. Also, the light irradiation may be controlled to be OFF faster than control of the spatial light modulator, by a device other than the light source.

The relative movement of the stage 2 and the head 40 in the main scanning direction and in the sub-scanning direction (i.e., relative movement of the writing cell group and the irradiation region group on the substrate 9) may be substituted by movement of only either one of the stage 2 and head 40.

Although the above preferred embodiments do not refer to control of light irradiation of the irradiation regions 61 located at the ends of the sub-scanning direction in the irradiation region group (e.g., part of the irradiation regions 61 on the (−X) and (−Y) portion in FIG. 4), light irradiation of those irradiation regions 61 is not necessarily required to be performed in terms of simplicity of control, and may be appropriately controlled taking into consideration writing performed after sub-scanning.

While the invention has been shown and described in detail, the foregoing description is in all aspects illustrative and not restrictive. It is therefore understood that numerous modifications and variations can be devised without departing from the scope of the invention.

What is claimed is:

1. A pattern writing apparatus for writing a pattern by applying light to a photosensitive material, comprising:

a light irradiating part for applying modulated light to each of irradiation regions of an irradiation region group which are arranged at equal pitches in two directions perpendicular to each other on a photosensitive material;

a scanning mechanism for scanning said irradiation region group over a photosensitive material in a scanning direction which is tilted relative to a direction of arrangement of said irradiation region group, and causing a plurality of irradiation regions to move relative to writing regions of a writing region group, respectively, said writing regions being fixedly arranged in said scanning direction and a direction perpendicular to said scanning direction at equal writing pitches on said photosensitive material; and a controller controlling an amount of light applied to each of said writing regions on a photosensitive material by exercising individual ON/OFF control of light irradiation of said irradiation region group in synchronization with scanning of said irradiation region group, wherein a center-to-center distance along said direction perpendicular to said scanning direction between adjacent irradiation regions arranged in a direction extending approximately along said scanning direction out of said two directions in which said irradiation regions are arranged is equal to said writing pitch, a center-to-center distance along said scanning direction between said adjacent irradiation regions is equal to "a times" said writing pitch (a is an integer equal to or larger than 2), said controller exercises ON/OFF control of said light irradiation once during relative movement of said irradiation region group by a distance equal to "n times" said writing pitch (n is an integer equal to or larger than 2), and ($a^2$+1) and n are relatively prime.

2. The pattern writing apparatus according to claim 1, wherein
a number of irradiation regions which are arranged in said direction extending approximately along said scanning direction out of said two directions of arrangement of said irradiation region group is M which is an integral multiple of (a×n).

3. The pattern writing apparatus according to claim 1, wherein
light irradiation of an irradiation region is controlled to be OFF before relative movement of said irradiation region group by a distance equal to n times said writing pitch is finished after light irradiation of said irradiation region is controlled to be ON.

4. The pattern writing apparatus according to claim 3, wherein
relative movement of said irradiation region group by said writing pitch is performed in a time period from a time when light irradiation of said irradiation region is controlled to be ON to a time when light irradiation of said irradiation region is controlled to be OFF.

5. The pattern writing apparatus according to claim 3, wherein
said light irradiating part comprises:
a light source which can be controlled ON/OFF; and
a spatial light modulator for spatially modulating light from said light source.

6. The pattern writing apparatus according to claim 1, wherein
said light irradiating part comprises:
a spatial light modulator having a lattice arrangement of a light modulating element group which spatially modulates reflected light;
a light source emitting light applied to said spatial light modulator; and
an optical system directing light from said light modulating element group to said irradiation region group, respectively.

7. The pattern writing apparatus according to claim 6, wherein
each element of said light modulating element group is a micromirror that changes its position.

8. The pattern writing apparatus according to claim 6, wherein
a pattern is written on a photoresist film on a substrate for a printed circuit board.

9. The pattern writing apparatus according to claim 6, wherein
said scanning mechanism continuously moves said irradiation region group.

10. A pattern writing method for writing a pattern by applying light to a photosensitive material, comprising the steps of:
applying modulated light to each of irradiation regions of an irradiation region group which are arranged at equal pitches in two directions perpendicular to each other on a photosensitive material, and scanning said irradiation region group over a photosensitive material in a scanning direction which is tilted relative to a direction of arrangement of said irradiation region group, to cause a plurality of irradiation regions to move relative to writing regions of a writing region group, respectively, said writing regions being fixedly arranged in said scanning direction and a direction perpendicular to said scanning direction at equal writing pitches on said photosensitive material; and
controlling an amount of light applied to each of said writing regions on a photosensitive material by exercising individual ON/OFF control of light irradiation of said irradiation region group in synchronization with scanning of said irradiation region group, wherein
a center-to-center distance along said direction perpendicular to said scanning direction between adjacent irradiation regions arranged in a direction extending approximately along said scanning direction out of said two directions in which said irradiation regions are arranged is equal to said writing pitch,
a center-to-center distance along said scanning direction between said adjacent irradiation regions is equal to "a times" said writing pitch (a is an integer equal to or larger than 2),
said controller exercises ON/OFF control of said light irradiation once during relative movement of said irradiation region group by a distance equal to "n times" said writing pitch (n is an integer equal to or larger than 2), and
$(a^2+1)$ and n are relatively prime.

11. The pattern writing method according to claim 10, wherein
a number of irradiation regions which are arranged in said direction extending approximately along said scanning direction out of said two directions of arrangement of said irradiation region group is M which is an integral multiple of (a×n).

12. The pattern writing method according to claim 10, wherein
light irradiation of an irradiation region is controlled to be OFF before relative movement of said irradiation region group by a distance equal to n times said writing pitch is finished after light irradiation of said irradiation region is controlled to be ON.

13. The pattern writing method according to claim 12, wherein
relative movement of said irradiation region group by said writing pitch is performed in a time period from a time when light irradiation of said irradiation region is controlled to be ON to a time when light irradiation of said irradiation region is controlled to be OFF.

14. The pattern writing method according to claim 12, wherein
modulated light is applied to each of said irradiation regions of said irradiation region group by spatially modulating light from a light source which can be controlled ON/OFF, and
light irradiation of said irradiation regions is controlled to be OFF by turning off said light source before relative movement of said irradiation region group by a distance equal to n times said writing pitch is finished.

15. The pattern writing method according to claim 10, wherein
light is applied to said irradiation region group through a spatial light modulator having a lattice arrangement of a light modulating element group which spacially modulates reflected light.

16. The pattern writing method according to claim 15, wherein
each element of said light modulating element group is a micromirror that changes its position.

17. The pattern writing method according to claim 10, wherein
said pattern is written on a photoresist film on a substrate for a printed circuit board.

18. The pattern writing method according to claim 10, wherein
said irradiation region group moves continuously.

* * * * *